United States Patent
Cao

(10) Patent No.: US 10,451,751 B2
(45) Date of Patent: Oct. 22, 2019

(54) CHARGE GENERATING DEVICES AND METHODS OF MAKING AND USE THEREOF

(71) Applicant: Ohio State Innovation Foundation, Columbus, OH (US)

(72) Inventor: Lei Cao, Upper Arlington, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 0 days.

(21) Appl. No.: 16/012,186

(22) Filed: Jun. 19, 2018

(65) Prior Publication Data
US 2018/0372891 A1    Dec. 27, 2018

Related U.S. Application Data

(60) Provisional application No. 62/521,692, filed on Jun. 19, 2017.

(51) Int. Cl.
  *H01L 31/11*     (2006.01)
  *G01T 3/08*      (2006.01)
  (Continued)

(52) U.S. Cl.
  CPC .............. *G01T 3/08* (2013.01); *G01T 1/244* (2013.01); *G21H 1/00* (2013.01); *G21H 1/02* (2013.01); *H01L 31/115* (2013.01)

(58) Field of Classification Search
  CPC .................................................. H01L 31/115
  See application file for complete search history.

(56) References Cited

U.S. PATENT DOCUMENTS

| 6,781,132 B2 | 8/2004 | Mcgregor |
| 6,921,903 B2 | 7/2005 | Mcgregor |
| (Continued) | | |

FOREIGN PATENT DOCUMENTS

WO    2016053413 A1    4/2016

OTHER PUBLICATIONS

Alam, et al., "Principles of Betavoltaic Battery Design", Journal of Energy, 2016, 3(1), 11-41.
(Continued)

*Primary Examiner* — Caridad Everhart
*Assistant Examiner* — Ankush K Singal
(74) *Attorney, Agent, or Firm* — Meunier Carlin & Curfman LLC

(57) ABSTRACT

Provided herein are charge generating devices and methods of making and use thereof. The charge generating devices comprise a substrate having a top surface; a plurality of spaced-apart three-dimensional elements disposed on the top surface of the substrate; and a plurality of cavities formed by the plurality of spaced-apart three-dimensional elements, the plurality of cavities being the area between the plurality of spaced-apart three-dimensional elements. The charge generating devices can further comprise a radioactive layer disposed on at least a portion of the plurality of spaced-apart three-dimensional elements and the top surface such that the plurality of cavities and the top surface are substantially coated by the radioactive layer. In some examples, the charge generating devices can comprise a radiation material and/or a scintillating material disposed within at least a portion of the plurality of cavities.

76 Claims, 29 Drawing Sheets

(51) Int. Cl.
*H01L 31/115* (2006.01)
*G21H 1/02* (2006.01)
*G01T 1/24* (2006.01)
*G21H 1/00* (2006.01)

(56) References Cited

U.S. PATENT DOCUMENTS

| | | | |
|---|---|---|---|
| 7,164,138 B2 | 1/2007 | Mcgregor et al. | |
| 7,855,372 B2 | 12/2010 | Mcgregor et al. | |
| 7,939,986 B2 | 5/2011 | Chandrashekhar et al. | |
| 8,178,384 B1 * | 5/2012 | Roscheisen | B82Y 10/00 438/57 |
| 8,778,715 B2 | 7/2014 | Bellinger et al. | |
| 8,969,900 B2 * | 3/2015 | Sabathil | H01L 33/08 257/79 |
| 9,105,776 B2 * | 8/2015 | Lee | H01L 31/032 |
| 9,151,853 B2 | 10/2015 | Dahal et al. | |
| 9,406,833 B2 | 8/2016 | Dahal et al. | |
| 9,966,503 B2 * | 5/2018 | Straßburg | H01L 33/08 |
| 2007/0080605 A1 | 4/2007 | Chandrashekhar et al. | |
| 2014/0021827 A1 | 1/2014 | Noyes | |
| 2014/0264256 A1 | 9/2014 | Nikolic et al. | |
| 2015/0028217 A1 | 1/2015 | Zaitseva et al. | |
| 2016/0356901 A1 | 12/2016 | Shao et al. | |

OTHER PUBLICATIONS

Cheng, et al., "A high open-circuit voltage gallium nitride betavoltaic microbattery", Journal of Micromechanics and Microengineering, 2012, 22(7), 074011.

Dixon, et al., "Evaluation of a Silicon 90Sr Betavoltaic Power Source", Sci. Rep. 2016, 6, 38182.

Lu, et al., "Gallium Nitride for Nuclear Batteries", Advanced Materials Research, 2012, 343-344, 56-61.

Munson, et al., "Model of Ni-63 battery with realistic PIN structure", Journal of Applied Physics, 2015, 118, 105101.

Olsen, et al., "Betavoltaic power sources", Phys. Today, 2012, 65, 35-38.

Panferov, et al., "Modeling Quantum Efficiency of Ultraviolet 6H—SiC Photodiodes", IEEE Transactions on Electron Devices, 2011, 58(11), 3976-3983.

Prelas, et al., "A review of nuclear batteries", Progress in Nuclear Energy 2014, 75, 117-148.

* cited by examiner

Am-241 source
Diameter: 17.9 mm

Photon emission from PVT coating

CHARGE GENERATING DEVICES AND METHODS OF MAKING AND USE THEREOF

CROSS-REFERENCE TO RELATED APPLICATIONS

This application claims the benefit of priority to U.S. Provisional Application 62/521,692, filed Jun. 19, 2017, which is hereby incorporated herein by reference in its entirety.

STATEMENT OF GOVERNMENT SUPPORT

This invention was made with Government support under Grant No. DE-NE0008407 awarded by the Department of Energy. The Government has certain rights in the invention.

BACKGROUND

There are many areas where a robust, long-term, low-maintenance power supply is needed, such as in deep sea exploration, interplanetary and interstellar exploration, cardiac pacemakers, polar explorations, and military equipment. The devices and methods discussed herein address these and other needs.

SUMMARY

In accordance with the purposes of the disclosed devices and methods, as embodied and broadly described herein, the disclosed subject matter relates to charge generating devices.

The charge generating devices can comprise a substrate having a top surface and a bottom surface; a plurality of spaced-apart three-dimensional elements disposed on the top surface of the substrate; and a plurality of cavities formed by the plurality of spaced-apart three-dimensional elements, the plurality of cavities being the area between the plurality of spaced-apart three-dimensional elements.

In some examples, the substrate and the plurality of spaced-apart three-dimensional elements can comprise a wide band-gap semiconductor, such as SiC, GaN, $Ga_2O_3$, diamond, GaAs, AlN, AlGaN, $Al_2O_3$, BN, AlAs, GaP, InP, $B_4C$, or combinations thereof. In some examples, the substrate and the plurality of spaced-apart three-dimensional elements can comprise SiC, diamond, GaN, $Ga_2O_3$, or $Al_2O_3$. In some examples, the plurality of spaced-apart three-dimensional elements are integrally formed with the substrate.

Each of the plurality of spaced-apart three-dimensional elements can have an average characteristic of from 0.5 µm to 500 µm. Each of the plurality of spaced-apart three-dimensional elements can have an average height of from 1 µm to 500 µm. In some examples, the plurality of spaced-apart three-dimensional elements can form an array and each of the plurality of spaced-apart three-dimensional elements is separated from its neighboring three-dimensional elements 108 by a distance of from 1 µm to 500 µm (edge to edge). For example, the plurality of spaced-apart three-dimensional elements can form a rectangular array, a hexagonal array, or a linear array.

The devices can, in some examples, further comprise a radioactive layer disposed on at least a portion of the plurality of spaced-apart three-dimensional elements and the top surface such that the plurality of cavities and the top surface are substantially coated by the radioactive layer, thereby forming a plurality of coated cavities. The radioactive layer can, for example, emit alpha radiation, beta radiation, gamma radiation, or a combination thereof. In some examples, the radioactive layer emits alpha radiation. The radioactive layer can comprise a radioisotope. For example, the radioactive layer can comprise $^{148}Gd$, $^{238}Pu$, $^{208}Po$, $^{210}Po$, $^{243}Cm$, $^{244}Cm$, $^{241}Am$, $^{63}Ni$, $^{106}Ru$, $^{235}U$, $^{204}Tl$, $^{14}C$, $^{3}H$, $^{85}Kr$, $^{90}Sr$, $^{90}Y$, $^{147}Pm$, $^{109}Gd$, or a combination thereof. In some examples, the radioactive layer comprises $^{241}Am$. The radioactive layer can, for example, have a thickness of from 0.1 µm to 100 µm.

The devices can further comprise a first conducting layer disposed above the plurality of spaced-apart three-dimensional elements, wherein the first conducting layer is in electric contact with at least a portion of the plurality of spaced-apart three-dimensional elements. The devices can further comprise a second conducting layer disposed below the substrate, wherein the second conducting layer is in electric contact with the bottom surface of the substrate. In some examples, the first conducting layer, the second conducting layer, or a combination thereof comprise(s) a metal. The metal can comprise, for example, a metal selected from the group consisting of Al, Ti, Ni, Cu, Ga, Ag, Ir, Pt, Au, Cr, Mo, Pd, W, and combinations thereof. In some examples, the first conducting layer, the second conducting layer, or a combination thereof can comprise(s) a radioisotope. For example, the first conducting layer, the second conducting layer, or a combination thereof comprise(s) $^{63}Ni$.

The devices can further comprise a first scintillation layer disposed above the first conducting layer and in radiative contact with the first conducting layer. In some examples, the devices can further comprise a second scintillation layer disposed below the second conducting layer and in radiative contact with the second conducting layer. In some examples, the first scintillation layer can be in physical contact with the first conducting layer. In some examples, the second scintillation layer can be in physical contact with the second conducting layer. The first scintillation layer, the second scintillation layer, or a combination thereof can comprise(s) a scintillating material selected from the group consisting of a ZnS-based phosphor, NaI, CsI, cerium-doped lutetium yttrium orthosilicate ($Ce:Lu_{1.8}Y_{0.2}SiO_5$, LYSO), bismuth germanate ($Bi_4Ge_3O_{12}$, BGO), plastic, $CeF_3$, europium doped calcium fluoride ($Eu:CaF_2$), $PbWO_4$, $CdWO_4$, cerium doped cesium lithium yttrium chloride ($Ce:Cs_2LiYCl_6$, CLYC), $Ce:LaCl_3$, $CeBr_3$, $Ce:LaBr_3$, praseodymium doped lutetium aluminum garnet ($Pr:Lu_3Al_5O_{12}$, Pr:LuAG), cerium doped lutetium aluminum perovskite ($Ce:LuAlO_3$, Ce:LuAP), $Ce:Lu_3Al_5O_{12}$, cerium doped yttrium orthosilicate ($Ce:Y_2SiO_5$, Ce:YSO), cerium doped yttrium aluminum perovskite ($Ce:YAlO_3$; Ce:YAP), cerium doped yttrium aluminum garnet ($Ce:Y_3Al_5O_{12}$, Ce:YAG), and combinations thereof.

In some examples, the device can further comprise a scintillating material disposed within at least a portion of the plurality of coated cavities; a layer of a scintillating material disposed on the radioactive layer, such that the plurality of coated cavities are substantially coated by the layer of scintillating material; or a combination thereof. The scintillating material can, for example, be selected from the group consisting of a ZnS-based phosphor, CsI, thallium-doped sodium iodide (Tl:NaI), cerium-doped lutetium yttrium orthosilicate ($Ce:Lu_{1.8}Y_{0.2}SiO_5$, LYSO), bismuth germanate ($Bi_4Ge_3O_{12}$, BGO), plastic, $CeF_3$, europium doped calcium fluoride ($Eu:CaF_2$), $PbWO_4$, $CdWO_4$, cerium doped cesium lithium yttrium chloride ($Ce:Cs_2LiYCl_6$, CLYC), $Ce:LaCl_3$, $CeBr_3$, $Ce:LaBr_3$, praseodymium doped lutetium aluminum garnet (Pr:Lu$_3$Al$_5$O$_{12}$, Pr:LuAG), cerium doped lutetium aluminum perovskite (Ce:LuAlO$_3$, Ce:LuAP), Ce:Lu$_3$Al$_5$O$_{12}$, cerium doped yttrium orthosilicate (Ce:Y$_2$SiO$_5$, Ce:YSO), cerium doped yttrium aluminum perovskite (Ce:YAlO$_3$; Ce:YAP), cerium doped yttrium aluminum garnet (Ce:Y$_3$Al$_5$O$_{12}$, Ce:YAG), and combinations thereof. In some examples, the scintillating material 124 can perform as an energy degrader.

Also disclosed herein are charge generating devices comprising: a substrate having a top surface and a bottom surface; a plurality of spaced-apart three-dimensional elements disposed on the top surface of the substrate; a plurality of cavities formed by the plurality of spaced-apart three-dimensional elements, the plurality of cavities being the area between the plurality of spaced-apart three-dimensional elements; a radioactive material disposed within at least a portion of the plurality of cavities, thereby forming a plurality of at least partially filled cavities; a first conducting layer disposed above the plurality of at least partially filled cavities and the plurality of spaced-apart three-dimensional elements, wherein the first conducting layer is in electric contact with the plurality of spaced-apart three-dimensional elements; a second conducting layer disposed below the substrate, wherein the second conducting layer is in electric contact with the bottom surface of the substrate; a first scintillation layer disposed above the first conducting layer and in radiative contact with the first conducting layer; and a second scintillation layer disposed below the second conducting layer and in radiative contact with the second conducting layer. In some examples, the plurality of spaced-apart three-dimensional elements are integrally formed with the substrate.

Also disclosed herein are charge generating devices comprising: a substrate having a top surface and a bottom surface; a plurality of spaced-apart three-dimensional elements disposed on the top surface of the substrate; a plurality of cavities formed by the plurality of spaced-apart three-dimensional elements, the plurality of cavities being the area between the plurality of spaced-apart three-dimensional elements; a scintillating material disposed within at least a portion of the plurality of cavities, thereby forming a plurality of at least partially filled cavities; a first conducting layer disposed above the plurality of at least partially filled cavities and the plurality of spaced-apart three-dimensional elements, wherein the first conducting layer is in electric contact with the plurality of spaced-apart three-dimensional elements; a second conducting layer disposed below the substrate, wherein the second conducting layer is in electric contact with the bottom surface of the substrate; a first scintillation layer disposed above the first conducting layer and in radiative contact with the first conducting layer; and a second scintillation layer disposed below the second conducting layer and in radiative contact with the second conducting layer. In some examples, the plurality of spaced-apart three-dimensional elements are integrally formed with the substrate. In some examples, the scintillating material is disposed as a layer on the plurality of spaced-apart three-dimensional elements, such that the first conducting layer is in electric contact with the plurality of spaced-apart three-dimensional elements through the layer of the scintillating material.

In some examples, the device can further comprise a radioactive layer disposed on at least a portion of the plurality of spaced-apart three-dimensional elements and the top surface such that the plurality of cavities and the top surface are substantially coated by the radioactive layer, thereby forming a plurality of coated cavities such that the scintillating material is disposed within at least a portion of the plurality of coated cavities.

In some examples, the devices can further comprise a charge storage device electrically coupled to the first conducting layer and the second conducting layer.

Also disclosed herein are methods of making the devices disclosed herein. For example, the methods can comprise forming the plurality of spaced-apart three-dimensional elements on the top surface of the substrate; and depositing the radioactive layer on at least a portion of the plurality of spaced-apart three-dimensional elements and the top surface such that the plurality of cavities and the top surface are substantially coated by the radioactive layer, thereby forming the plurality of coated cavities.

In some examples, wherein the device further comprises a scintillating material disposed within at least a portion of the plurality of coated cavities, the method further comprises depositing the scintillating material within at least a portion of the plurality of coated cavities. In some examples, therein the scintillating material comprises a radioactive scintillating material, the method further comprises depositing the radioactive scintillating material within at least a portion of the plurality of coated cavities.

In some examples, the methods of making the device can comprise forming the plurality of spaced-apart three-dimensional elements on the top surface of the substrate; and depositing the scintillating material within at least a portion of the plurality of cavities.

Additional advantages of the disclosed devices and methods will be set forth in part in the description which follows, and in part will be obvious from the description. The advantages of the disclosed devices and methods will be realized and attained by means of the elements and combinations particularly pointed out in the appended claims. It is to be understood that both the foregoing general description and the following detailed description are exemplary and explanatory only and are not restrictive of the disclosed devices and methods, as claimed.

The details of one or more embodiments of the invention are set forth in the accompanying drawings and the description below. Other features, objects, and advantages of the invention will be apparent from the description and drawings, and from the claims.

DESCRIPTION OF FIGURES

The accompanying figures, which are incorporated in and constitute a part of this specification, illustrate several aspects of the disclosure, and together with the description, serve to explain the principles of the disclosure.

DETAILED DESCRIPTION

Devices

Figure 1:
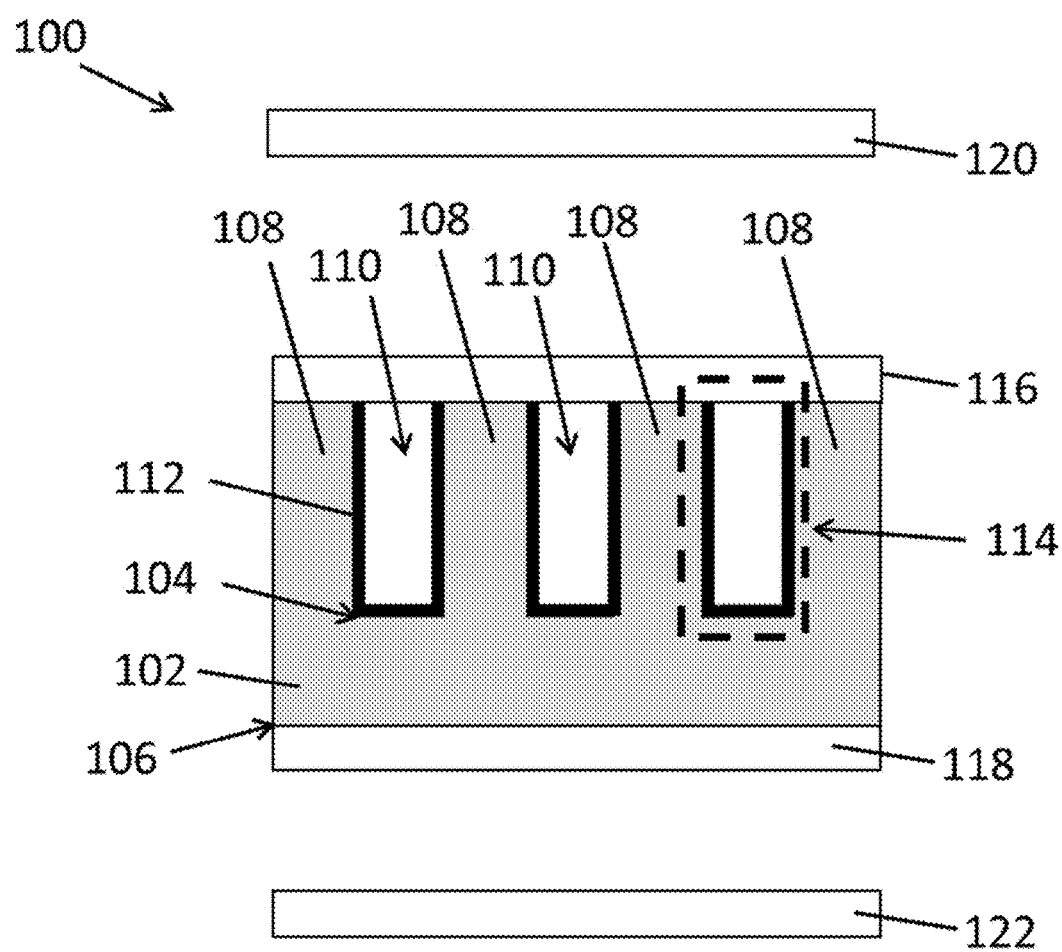
FIG. 1 is a schematic representation of an exemplary device as disclosed herein.

Discussed herein are charge generating devices (e.g., electricity generating devices). Referring now to FIG. 1, in some examples the devices 100 can comprise a substrate 102 having a top surface 104 and a bottom surface 106; a plurality of spaced-apart three-dimensional elements 108 disposed on the top surface 104 of the substrate 102; and a plurality of cavities 110 formed by the plurality of spaced-apart three-dimensional elements 108, the plurality of cavities 110 being the area between the plurality of spaced-apart three-dimensional elements 108.

The substrate 102 and the plurality of spaced-apart three-dimensional elements 108 can be fabricated from any suitable material or combination of materials compatible with the devices and methods described herein. In some examples, the substrate 102 and the plurality of spaced-apart three-dimensional elements 108 comprise a wide band-gap semiconductor. Examples of suitable materials for the substrate 102 and the plurality of spaced-apart three-dimensional elements 108 include, but are not limited to, SiC, GaN, $Ga_2O_3$, diamond, GaAs, AlN, AlGaN, $Al_2O_3$, BN, AlAs, GaP, InP, $B_4C$, and combinations thereof. In some examples, the substrate 102 and the plurality of spaced-apart three-dimensional elements 108 can comprise SiC, diamond, GaN, $Ga_2O_3$, or $Al_2O_3$. In some examples, the plurality of spaced-apart three-dimensional elements 108 are integrally formed with the substrate 102.

The plurality of spaced-apart three-dimensional elements 108 can comprise three-dimensional elements with a cross-section in the plane of the first surface 104 of any regular or irregular shape (e.g., a circle, an ellipse, a triangle, a square, a rectangle, a hexagon, an octagon, a star, a polygon, an irregular shape, etc.). In some examples, the cross-section in the plane of the first surface 104 of plurality of spaced-apart three-dimensional elements 108 can be an isotropic shape. In some examples, the cross-section in the plane of the first surface 104 of plurality of spaced-apart three-dimensional elements 108 can be an anisotropic shape.

Each of the plurality of spaced-apart three-dimensional elements 108 can have an average characteristic dimension. The term "characteristic dimension," as used herein, refers to the largest straight line distance spanning a spaced-apart three-dimensional element 108 in the plane of the first surface 104. For example, in the case of a spaced-apart three-dimensional element 108 having a substantially circular shape in the plane of the first surface 104, the characteristic dimension of the spaced-apart three-dimensional element 108 is the diameter of the spaced-apart three-dimensional element. "Average characteristic dimension" and "mean characteristic dimension" are used interchangeably herein, and generally refer to the statistical mean characteristic dimension of the spaced-apart three-dimensional elements in a population of spaced-apart three-dimensional elements. The characteristic dimension can be measured using methods known in the art, such as evaluation by optical microscopy, scanning electron microscopy, transmission electron microscopy, and/or atomic force microscopy.

In some examples, each of the plurality of spaced-apart three-dimensional elements 108 can have an average characteristic dimension of 0.5 micrometers (μm) or more (e.g., 1 μm or more, 2 μm or more, 3 μm or more, 4 μm or more, 5 μm or more, 10 μm or more, 15 μm or more, 20 μm or more, 25 μm or more, 30 μm or more, 40 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, or 400 μm or more). In some examples, each of the plurality of spaced-apart three-dimensional elements 108 can have an average characteristic dimension of 500 μm or less (e.g., 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 40 μm or less, 30 μm or less, 25 μm or less, 20 μm or less, 15 μm or less, 10 μm or less, or 5 μm or less). The average characteristic dimension of each of the plurality of spaced-apart three-dimensional elements 108 can range from any of the minimum values described above to any of the maximum values described above. For example, each of the plurality of spaced-apart three-dimensional elements 108 can have an average characteristic dimension of from 0.5 μm to 500 μm (e.g., from 0.5 μm to 250 μm, from 250 μm to 500 μm, from 0.5 μm to 100 μm, from 100 μm to 200 μm, from 200 μm to 300 μm, from 300 μm to 400 μm, from 400 μm to 500 μm, or from 2 μm to 400 μm).

Each of the plurality of spaced-apart three-dimensional elements 108 can have an average height. As used herein, the height of a three-dimensional element 108 refers to the largest straight line distance spanning the three-dimensional element 108 in a plane perpendicular to the first surface 104. For example, in the case of a three-dimensional element 108 having a substantially cylindrical shape, with the cross-section of the three-dimensional element 108 having a circular shape in the plane of the first surface 104, the height of the three-dimensional element 108 is the height of the cylindrical three-dimensional element 108. "Average height" of a plurality of spaced-apart three-dimensional elements 108 and "mean thickness" of a plurality of spaced-apart three-dimensional elements 108 are used interchangeably herein, and generally refer to the statistical mean thickness of the three-dimensional elements 108 in a population of three-dimensional element 108. The height of the plurality of spaced-apart three-dimensional elements 108 can be measured using methods known in the art, such as evaluation by optical microscopy, scanning electron microscopy, transmission electron microscopy, and/or atomic force microscopy.

For example, each of the plurality of spaced-apart three-dimensional elements 108 can have an average height of 1 μm or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 55 μm or more, 60 μm or more, 65 μm or more, 70 μm or more, 75 μm or more, 80 μm or more, 85 μm or more, 90 μm or more, 100 μm or more, 110 μm or more, 120 μm or more, 130 μm or more, 140 μm or more, 150 μm or more, 160 μm or more, 170 μm or more, 180 μm or more, 190 μm or more, 200 μm or more, 225 μm or more, 250 μm or more, 275 μm or more, 300 μm or more, 325 μm or more, 350 μm or more, 375 μm or more, 400 μm or more, 425 μm or more, or 450 μm or more). In some examples, each of the plurality of spaced-apart three-dimensional elements 108 can have an average height of 500 μm or less (e.g., 475 μm or less, 450 μm or less, 425 μm or less, 400 μm or less, 375 μm or less, 350 μm or less, 325 μm or less, 300 μm or less, 275 μm or less, 250 μm or less, 225 μm or less, 200 μm or less, 190 μm or less, 180 μm or less, 170 μm or less, 160 μm or less, 150 μm or less, 140 μm or less, 130 μm or less, 120 μm or less, 110 μm or less, 100 μm or less, 95 μm or less, 90 μm or less, 85 μm or less, 80 μm or less, 75 μm or less, 70 μm or less, 65 μm or less, 60 μm or less, 55 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, or 5 μm or less). The average height of each of the plurality of spaced-apart three-dimensional elements 108 can range from any of the minimum values described above to any of the maximum values described above. For example, each of the plurality of spaced-apart three-dimensional elements 108 can have an average height of from 1 μm to 500 μm (e.g., from 1 μm to 250 μm, from 250 μm to 500 μm, from 1 μm to 100 μm, from 100 μm to 200 μm, from 200 μm to 300 μm, from 300 μm to 400 μm, from 400 μm to 500 μm, from 1 μm to 400 μm, from 1 μm to 300 μm, from 1 μm to 200 μm, from 1 μm to 50 μm, from 50 μm to 100 μm, from 1 μm to 20 μm, from 20 μm to 40 μm, from 40 μm to 60 μm, from 60 μm to 80 μm, from 80 μm to 100 μm, or from 5 μm to 90 μm).

In some examples, the average characteristic dimension of each of the plurality of spaced-apart three-dimensional elements 108 can be substantially the same along the height of each of the plurality of spaced-apart three-dimensional elements 108.

Figure 2:
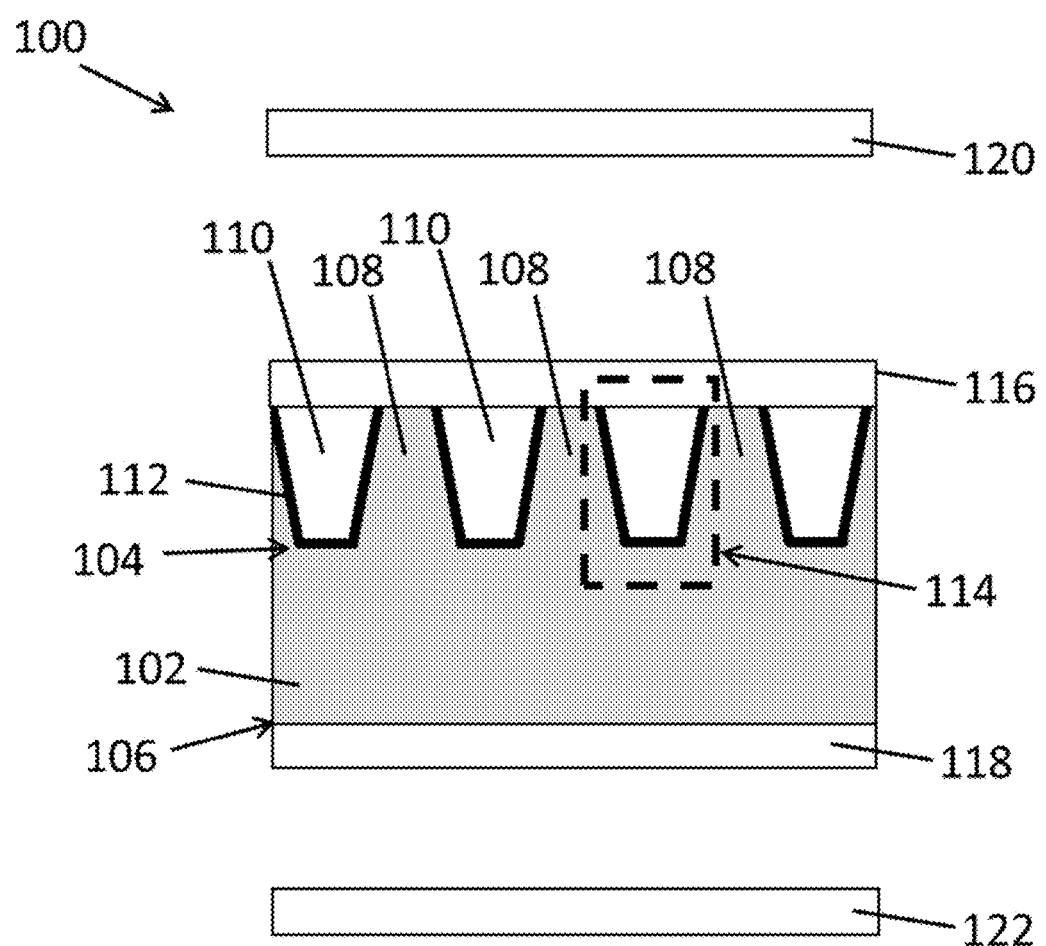
FIG. 2 is a schematic representation of an exemplary device as disclosed herein.

In some examples, the plurality of spaced-apart three-dimensional elements 108 can have a tapered profile. For example, each of the plurality of spaced-apart three-dimensional elements 108 can have an upper portion and a lower portion, wherein the lower portion of each of the plurality of spaced-apart three dimensional elements 108 is positioned closer to the first surface 104 of the substrate 102 relative to the upper portion, where the average characteristic dimension of the upper portion is different than the average characteristic dimension of the lower portion. For example, the average characteristic dimension of the upper portion can be less than the average characteristic dimension of the lower portion. An example of a device where the plurality of spaced-apart three-dimensional elements 108 have a tapered profile is shown in FIG. 2.

Each of the plurality of spaced-apart three-dimensional elements 108 can have an aspect ratio. As used herein, the aspect ratio of each of the plurality of spaced-apart three-dimensional elements 108 is the ratio of the average characteristic dimension to the average height the three-dimensional element 108. For example, each of the plurality of spaced-apart three-dimensional elements 108 can have an aspect ratio of 1:200 or more (e.g., 1:175 or more, 1:150 or more, 1:125 or more, 1:100 or more, 1:75 or more, 1:50 or more, 1:25 or more, 1:10 or more, 1:5 or more, 1:4 or more, 1:3 or more, 1:2 or more, 1:1 or more, 2:1 or more, 3:1 or more, 4:1 or more, 5:1 or more, 10:1 or more, 25:1 or more, 50:1 or more, 75:1 or more, 100:1 or more, 125:1 or more, 150:1 or more, 175:1 or more, 200:1 or more, 250:1 or more, 300:1 or more, 350:1 or more, or 400:1 or more). In some examples, each of the plurality of spaced-apart three-dimensional elements 108 can have an aspect ratio of 500:1 or less (e.g., 450:1 or less, 400:1 or less, 350:1 or less, 300:1 or less, 250:1 or less, 200:1 or less, 175:1 or less, 150:1 or less, 125:1 or less, 100:1 or less, 75:1 or less, 50:1 or less, 25:1 or less, 10:1 or less, 5:1 or less, 4:1 or less, 3:1 or less, 2:1 or less, 1:1 or less, 1:2 or less, 1:3 or less, 1:4 or less, 1:5 or less, 1:10 or less, 1:25 or less, 1:50 or less, 1:75 or less, 1:100 or less, 1:125 or less, or 1:150 or less). The aspect ratio of each of the plurality of spaced-apart three-dimensional elements 108 can range from any of the minimum values described above to any of the maximum values described above. For example, each of the plurality of spaced-apart three-dimensional elements 108 can have an aspect ratio of from 1:200 to 500:1 (e.g., from 1:200 to 1:1, from 1:1 to 500:1, from 1:200 to 2:1. from 5:1 to 500:1, from 1:200 to 200:1, from 1:100 to 100:1, or from 1:150 to 400:1).

In some examples, the plurality of spaced-apart three-dimensional elements 108 can form an array and each of the plurality of spaced-apart three-dimensional elements 108 is separated from its neighboring three-dimensional elements 108 by a distance of 1 μm or more (edge to edge) (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 55 μm or more, 60 μm or more, 65 μm or more, 70 μm or more, 75 μm or more, 80 μm or more, 85 μm or more, 90 μm or more, 100 μm or more, 110 μm or more, 120 μm or more, 130 μm or more, 140 μm or more, 150 μm or more, 160 μm or more, 170 μm or more, 180 μm or more, 190 μm or more, 200 μm or more, 225 μm or more, 250 μm or more, 275 μm or more, 300 μm or more, 325 μm or more, 350 μm or more, 375 μm or more, 400 μm or more, 425 μm or more, or 450 μm or more). In some examples, the plurality of spaced-apart three-dimensional elements 108 can form an array and each of the plurality of spaced-apart three-dimensional elements 108 is separated from its neighboring three-dimensional elements 108 by a distance of 500 μm or less (e.g., 475 μm or less, 450 μm or less, 425 μm or less, 400 μm or less, 375 μm or less, 350 μm or less, 325 μm or less, 300 μm or less, 275 μm or less, 250 μm or less, 225 μm or less, 200 μm or less, 190 μm or less, 180 μm or less, 170 μm or less, 160 μm or less, 150 μm or less, 140 μm or less, 130 μm or less, 120 μm or less, 110 μm or less, 100 μm or less, 95 μm or less, 90 μm or less, 85 μm or less, 80 μm or less, 75 μm or less, 70 μm or less, 65 μm or less, 60 μm or less, 55 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, or 5 μm or less). The distance each of the plurality of spaced-apart three-dimensional elements 108 is separated from its neighboring three-dimensional elements 108 in the array can range from any of the minimum values described above to any of the maximum values described above. For example, the plurality of spaced-apart three-dimensional elements 108 can form an array and each of the plurality of spaced-apart three-dimensional elements 108 is separated from its neighboring three-dimensional elements 108 by a distance of from 1 μm to 500 μm (edge to edge) (e.g., from 1 μm to 250 μm, from 250 μm to 500 μm, from 1 μm to 100 μm, from 100 μm to 200 μm, from 200 μm to 300 μm, from 300 μm to 400 μm, from 400 μm to 500 μm, from 1 μm to 400 μm, from 1 μm to 300 μm, from 1 μm to 200 μm, from 1 μm to 50 μm, from 50 μm to 100 μm, from 1 μm to 20 μm, from 20 μm to 40 μm, from 40 μm to 60 μm, from 60 μm to 80 μm, from 80 μm to 100 μm, or from 5 μm to 90 μm).

Figure 3:
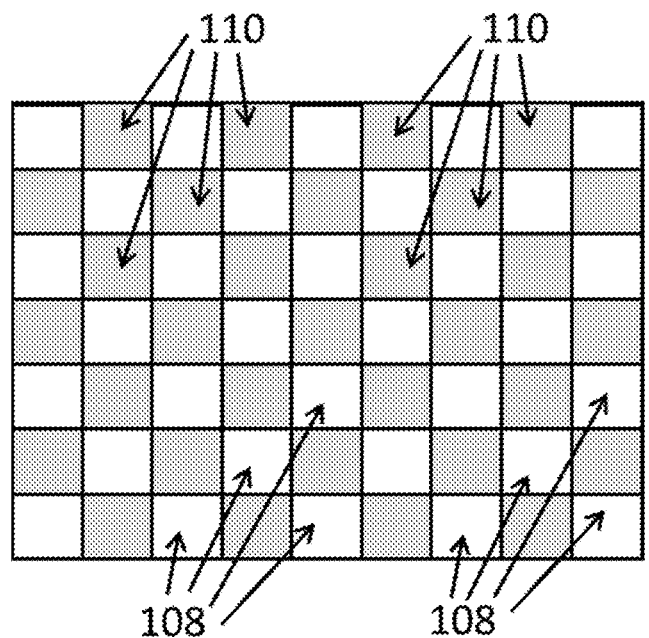
FIG. 3 is a schematic representation of an exemplary array of the plurality of spaced-apart three-dimensional elements as disclosed herein.
Figure 4:
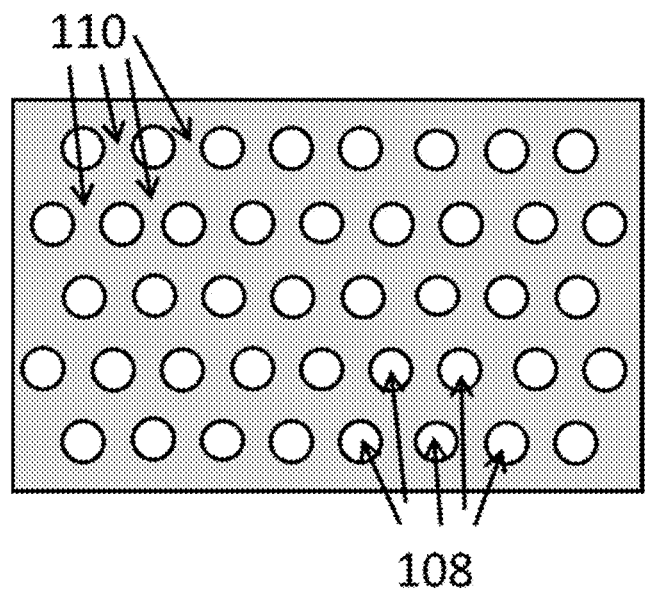
FIG. 4 is a schematic representation of an exemplary array of the plurality of spaced-apart three-dimensional elements as disclosed herein.
Figure 5:
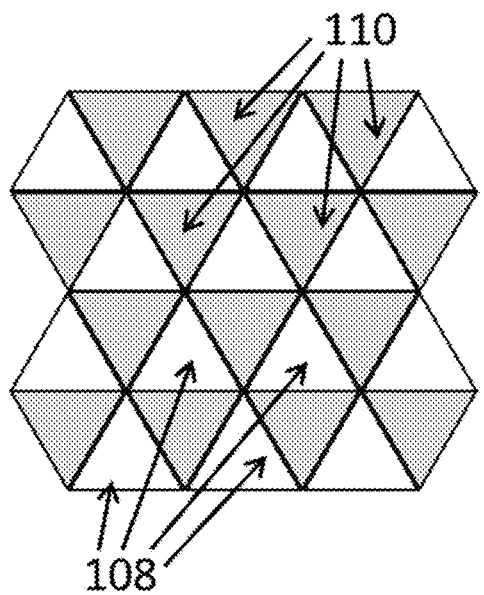
FIG. 5 is a schematic representation of an exemplary array of the plurality of spaced-apart three-dimensional elements as disclosed herein.
Figure 6:
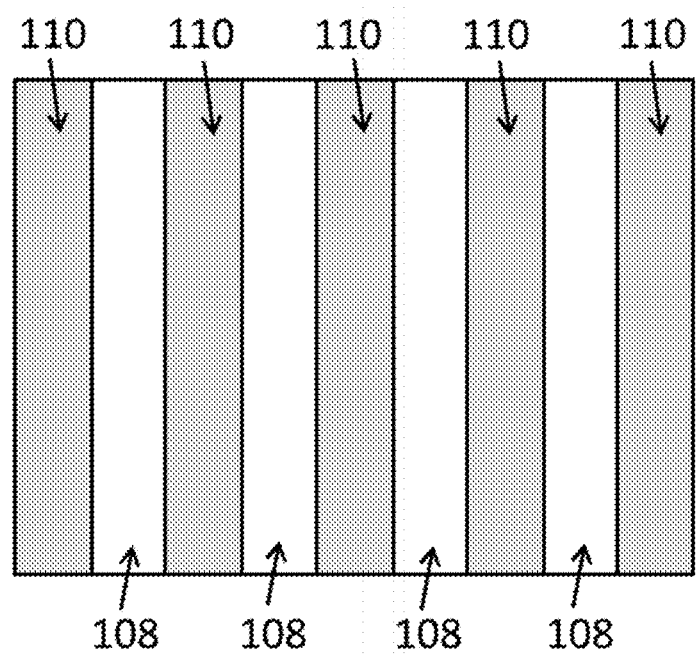
FIG. 6 is a schematic representation of an exemplary array of the plurality of spaced-apart three-dimensional elements as disclosed herein.
Figure 7:
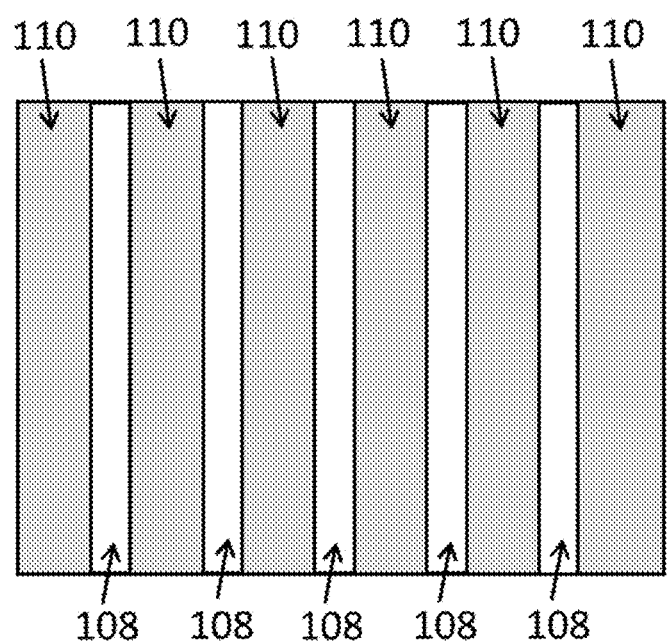
FIG. 7 is a schematic representation of an exemplary array of the plurality of spaced-apart three-dimensional elements as disclosed herein.

For example, the plurality of spaced-apart three-dimensional elements 108 can form a rectangular array (e.g., as shown in FIG. 3), a hexagonal array (e.g., as shown in FIG. 4 and FIG. 5), or a linear array (e.g., as shown in FIG. 6 and FIG. 7). Top down views (e.g., looking down at the top surface 104 of the substrate 102) of devices 100 showing exemplary arrays formed by the plurality of spaced-apart three-dimensional elements 108 and the plurality of cavities 110 are shown in FIG. 3-FIG. 7, the gray elements represent the plurality of cavities 110 and the white elements represent the plurality of spaced-apart three-dimensional elements 108.

The plurality of cavities 110 formed by the plurality of spaced-apart three-dimensional elements 108 can have a cross-section in the plane of the first surface 104 of any regular or irregular shape (e.g., a circle, an ellipse, a triangle, a square, a rectangle, a hexagon, an octagon, a star, a polygon, an irregular shape, etc.). In some examples, the cross-section in the plane of the first surface 104 of plurality of spaced-apart three-dimensional elements 108 can be an isotropic shape. In some examples, the cross-section in the plane of the first surface 104 of plurality of spaced-apart three-dimensional elements 108 can be an anisotropic shape. In some examples, the plurality of cavities 110 formed by the plurality of spaced-apart three-dimensional elements 108 can comprise a plurality of troughs.

The devices can, in some examples, further comprise a radioactive layer 112 disposed on at least a portion of the plurality of spaced-apart three-dimensional elements 108 and the top surface 104 such that the plurality of cavities 110 and the top surface 104 are substantially coated by the radioactive layer 112, thereby forming a plurality of coated cavities 114. The radioactive layer 112 can, for example, emit alpha radiation, beta radiation, gamma radiation, or a combination thereof. In some examples, the radioactive layer 112 emits alpha radiation. The radioactive layer 112 can comprise a radioisotope. For example, the radioactive layer 112 can comprise $^{148}$Gd, $^{238}$Pu, $^{208}$Po, $^{210}$Po, $^{243}$Cm, $^{244}$Cm, $^{241}$Am, $^{63}$Ni, $^{106}$Ru, $^{235}$U, $^{204}$Tl, $^{14}$C, $^{3}$H, $^{85}$Kr, $^{90}$Sr, $^{90}$Y, $^{147}$Pm, $^{109}$Gd, or a combination thereof. In some examples, the radioactive layer 112 comprises $^{241}$Am.

The radioactive layer 112 can, for example, have a thickness of 0.1 μm or more (e.g., 0.25 μm or more, 0.5 μm or more, 0.75 μm or more, 1 μm or more, 1.25 μm or more, 1.5 μm or more, 1.75 μm or more, 2 μm or more, 2.5 μm or more, 3 μm or more, 3.5 μm or more, 4 μm or more, 4.5 μm or more, 5 μm or more, 5.5 μm or more, 6 μm or more, 6.5 μm or more, 7 μm or more, 7.5 μm or more, 8 μm or more, 8.5 µm or more, 9 µm or more, 9.5 µm or more, 10 µm or more, 11 µm or more, 12 µm or more, 13 µm or more, 14 µm or more, 15 µm or more, 16 µm or more, 17 µm or more, 18 µm or more, 19 µm or more, 20 µm or more, 25 µm or more, 30 µm or more, 35 µm or more, 40 µm or more, 45 µm or more, 50 µm or more, 55 µm or more, 60 µm or more, 65 µm or more, 70 µm or more, 75 µm or more, 80 µm or more, 85 µm or more, or 90 µm or more). In some examples, the radioactive layer 112 can have a thickness of 100 µm or less (e.g., 95 µm or less, 90 µm or less, 85 µm or less, 80 µm or less, 75 µm or less, 70 µm or less, 65 µm or less, 60 µm or less, 55 µm or less, 50 µm or less, 45 µm or less, 40 µm or less, 35 µm or less, 30 µm or less, 25 µm or less, 20 µm or less, 19 µm or less, 18 µm or less, 17 µm or less, 16 µm or less, 15 µm or less, 14 µm or less, 13 µm or less, 12 µm or less, 11 µm or less, 10 µm or less, 9.5 µm or less, 9 µm or less, 8.5 µm or less, 8 µm or less, 7.5 µm or less, 7 µm or less, 6.5 µm or less, 6 µm or less, 5.5 µm or less, 5 µm or less, 4.5 µm or less, 4 µm or less, 3.5 µm or less, 3 µm or less, 2.5 µm or less, 2 µm or less, 1.75 µm or less, 1.5 µm or less, 1.25 µm or less, 1 µm or less, 0.75 µm or less, or 0.5 µm or less). The thickness of the radioactive layer 112 can range from any of the minimum values described above to any of the maximum values described above. For example, the radioactive layer 112 can have a thickness of from 0.1 µm to 100 µm (e.g., from 0.1 µm to 50 µm, from 50 µm to 100 µm, from 0.1 µm to 20 µm, from 20 µm to 40 µm, from 40 µm to 60 µm, from 60 µm to 80 µm, from 80 µm to 100 µm, from 0.1 µm to 90 µm, from 0.1 µm to 80 µm, from 0.1 µm to 70 µm, from 0.1 µm to 60 µm, from 0.1 µm to 50 µm, from 0.1 µm to 40 µm, from 0.1 µm to 30 µm, from 0.1 µm to 20 µm, from 0.1 µm to 10 µm, from 0.1 µm to 5 µm, from 5 µm to 10 µm, from 0.1 µm to 2 µm, from 2 µm to 4 µm, from 4 µm to 6 µm, from 6 µm to 8 µm, from 8 µm to 10 µm, or from 0.5 µm to 9 µm).

Figure 8:
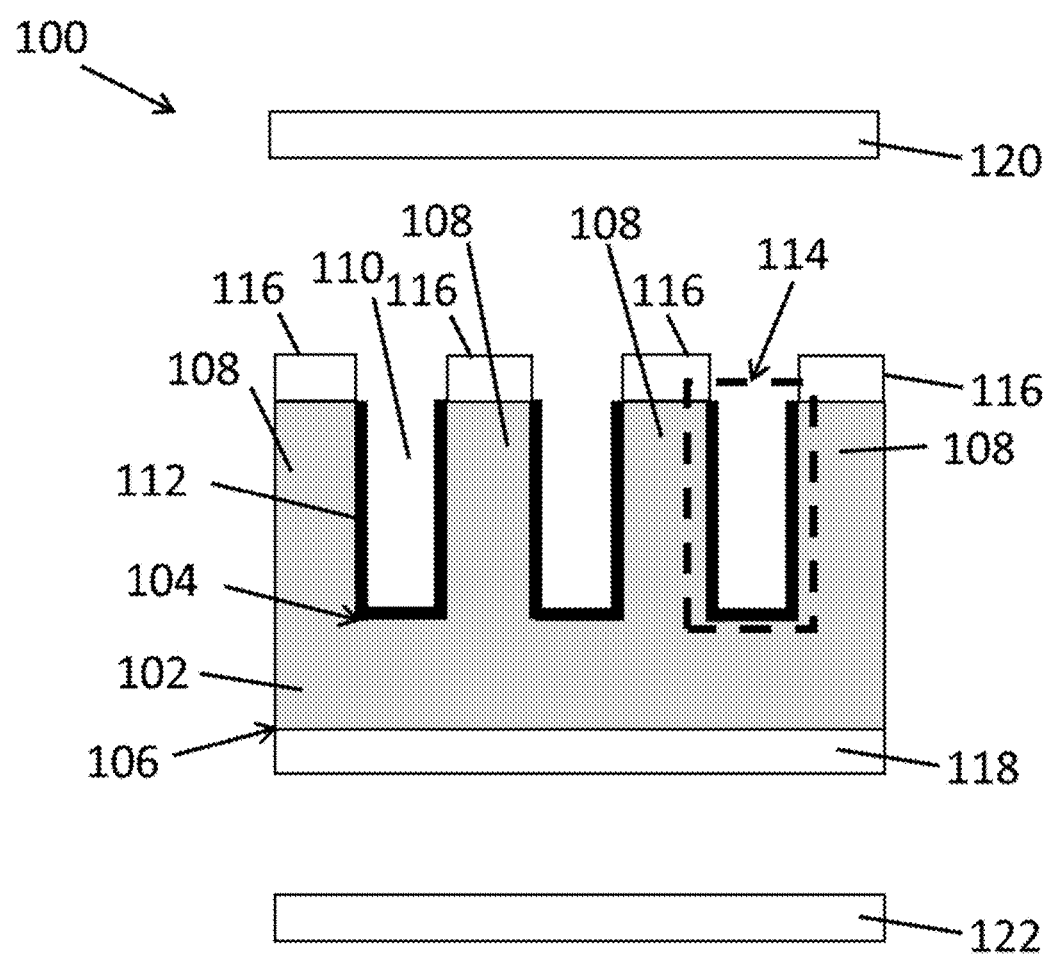
FIG. 8 is a schematic representation of an exemplary device as disclosed herein.

The devices can further comprise a first conducting layer 116 disposed above the plurality of spaced-apart three-dimensional elements 108, wherein the first conducting layer 116 is in electric contact with at least a portion of the plurality of spaced-apart three-dimensional elements 108. In some examples, the first conducting layer 116 forms a Schottky contact with at least a portion of the plurality of spaced-apart three-dimensional elements 108. In some examples, the first conducting layer 116 is in electric contact with each of the plurality of spaced-apart three-dimensional elements 108. In some examples, the first conducting layer 116 comprises a single continuous layer that is in electric contact with each of the plurality of spaced-apart three-dimensional elements 108. In some examples, the first conducting layer 116 comprises a plurality of conducting layers, wherein each of the plurality of conducting layers is in electric contact with one the plurality of spaced-apart three-dimensional elements 108, and each of the plurality of conducting layers is electrically connected to the other conducting layers, for example as shown in FIG. 8.

The devices can further comprise a second conducting layer 118 disposed below the substrate 102, wherein the second conducting layer 118 is in electric contact with the bottom surface 106 of the substrate 102.

The first conducting layer 116 and/or the second conducting layer 118 can comprise(s) a metal or a metal in combination with a transparent conducting oxide, a conducting polymer, a carbon material, or a combination thereof. In some examples, the first conducting layer 116, the second conducting layer 118, or a combination thereof comprise(s) a metal. The metal can comprise, for example, a metal selected from the group consisting of Al, Ti, Ni, Cu, Ga, Ag, Ir, Pt, Au, Cr, Mo, Pd, W, and combinations thereof. In some examples, the first conducting layer 116, the second conducting layer 118, or a combination thereof can comprise(s) a radioisotope. For example, the first conducting layer 116, the second conducting layer 118, or a combination thereof comprise(s) $^{63}$Ni.

Examples of carbon materials include, but are not limited to, graphitic carbon and graphites, including pyrolytic graphite (e.g., highly ordered pyrolytic graphite (HOPG)) and isotropic graphite, amorphous carbon, carbon black, single- or multi-walled carbon nanotubes, buckminsterfullerene ($C_{60}$), graphene, glassy carbon, diamond-like carbon (DLC) or doped DLC, such as boron-doped diamond, pyrolyzed photoresist films, and others known in the art.

In some examples, the first conducting layer 116 and/or the second conducting layer 118 can comprise a transparent conducting oxide. In some examples, the first conducting layer 116 and/or the second conducting layer 118 can comprise a metal oxide. Examples of metal oxides include simple metal oxides (e.g., with a single metal element) and mixed metal oxides (e.g., with different metal elements). The metal oxide can, for example, comprise a metal selected from the group consisting of Cd, Cr, Cu, Ga, In, Ni, Sn, Ti, W, Zn, and combinations thereof. In some examples, the first conducting layer 116 and/or the second conducting layer 118 can comprise CdO, $CdIn_{2O4}$, $Cd_2SnO_4$, $Cr_2O_3$, $CuCrO_2$, $CuO_2$, $Ga_2O_3$, $In_2O_3$, NiO, $SnO_2$, $TiO_2$, $ZnGa_2O_4$, ZnO, InZnO, InGaZnO, InGaO, ZnSnO, $Zn_2SnO_4$, CdSnO, $WO_3$, or combinations thereof.

In some examples, first conducting layer 116 and/or the second conducting layer 118 can comprise a conducting polymer such as polyacetylene, polyalanine, poly(3,4-ethylenedioxythiophene) polystyrene sulfonate, or combinations thereof.

The devices can further comprise a first scintillation layer 120 disposed above the first conducting layer 116 and in radiative contact with the first conducting layer 116. As used herein, radiative contact means that the first scintillation later is disposed relative to the first conducting layer 116 such that a photon emitted from the first scintillation layer 120 can reach and penetrate the first conducting layer 116 and/or such that an energetic particle emitted from the radiation layer 112 (e.g., alpha particle, beta particle, etc.) can contact the first scintillation layer 120. In some examples, the devices can further comprise a second scintillation layer 122 disposed below the second conducting layer 118 and in radiative contact with the second conducting layer 118.

In some examples, the first scintillation layer 120 can be in physical contact with the first conducting layer 116. In some examples, the second scintillation layer 122 can be in physical contact with the second conducting layer 118.

The first scintillation layer 120, the second scintillation layer 122, or a combination thereof comprise(s) a scintillating material selected from the group consisting of a ZnS-based phosphor, NaI, CsI, cerium-doped lutetium yttrium orthosilicate (Ce:$Lu_{1.8}Y_{0.2}SiO_5$, LYSO), bismuth germanate ($Bi_4Ge_3O_{12}$, BGO), plastic, $CeF_3$, europium doped calcium fluoride (Eu:$CaF_2$), $PbWO_4$, $CdWO_4$, cerium doped cesium lithium yttrium chloride (Ce:$Cs_2LiYCl_6$, CLYC), Ce:$LaCl_3$, Ce:$Br_3$, Ce:$LaBr_3$, praseodymium doped lutetium aluminum garnet (Pr:$Lu_3Al_5O_{12}$, Pr:LuAG), cerium doped lutetium aluminum perovskite (Ce:$LuAlO_3$, Ce:LuAP), Ce:$Lu_3Al_5O_{12}$, cerium doped yttrium orthosilicate (Ce:$Y_2SiO_5$, Ce:YSO), cerium doped yttrium aluminum perovskite (Ce:$YAlO_3$; Ce:YAP), cerium doped yttrium aluminum garnet (Ce:$Y_3Al_5O_{12}$, Ce:YAG), and combinations thereof. In some examples, the first scintillation layer 120, the second scintillation layer 122, or a combination thereof can comprise(s) a scintillating material that can perform as an energy degrader.

The first scintillation layer 120, the second scintillation layer 122, or a combination thereof can, for example, comprise a scintillating material that can be radioactive such that photons can be generated directly from within the scintillating materials upon exposure to radiation. For example, Na and I in Tl:NaI could be $^{22}$Na or $^{131}$I to form Tl:$^{22}$NaI, Tl:Na$^{131}$I, or Tl:$^{22}$Na$^{131}$I. $^{22}$Na undergoes beta+ decay, emitting positron and gamma rays, which can deposit energy in the plurality of spaced-apart three-dimensional structures and/or the substrate to generate charge or electricity and can also produce photons within Tl:NaI, subsequently depositing energy in the plurality of spaced-apart three-dimensional structures and/or the substrate to generate charge or electricity.

Figure 9:
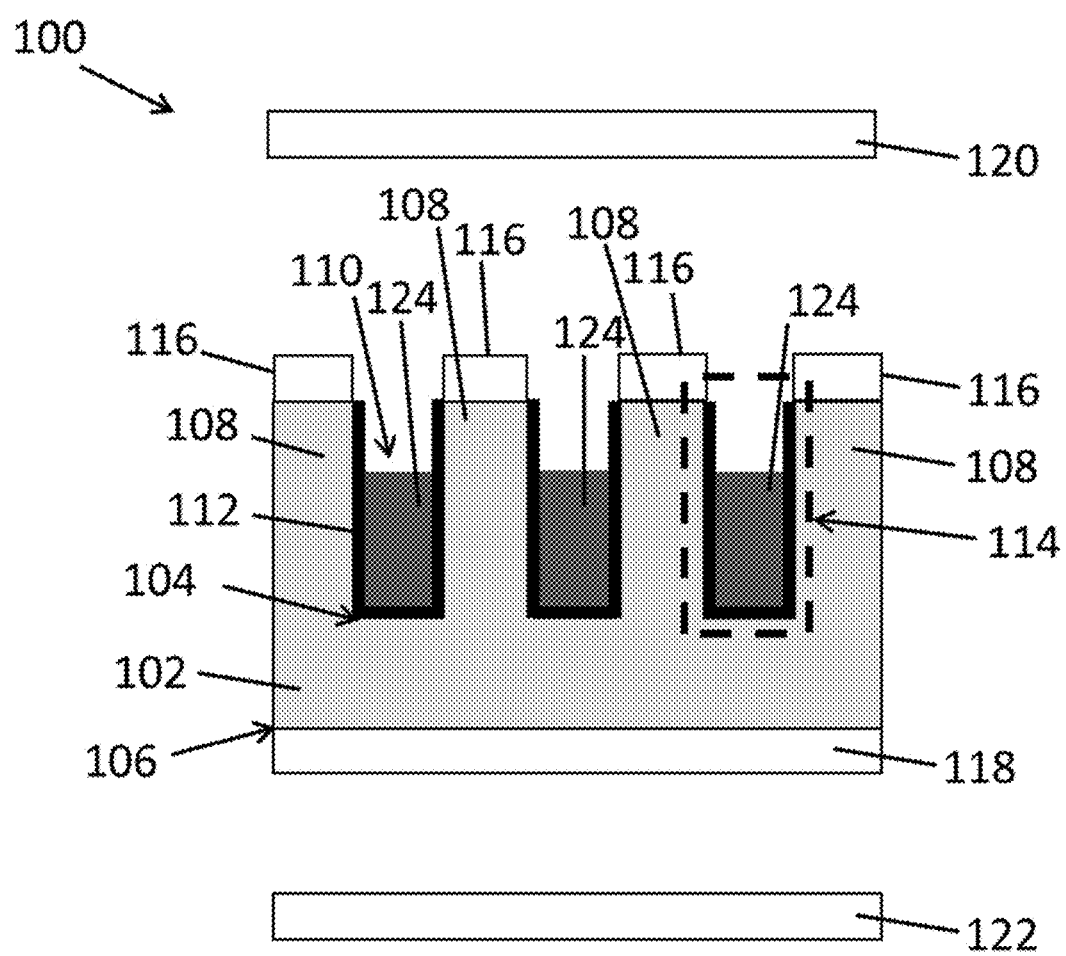
FIG. 9 is a schematic representation of an exemplary device as disclosed herein.
Figure 10:
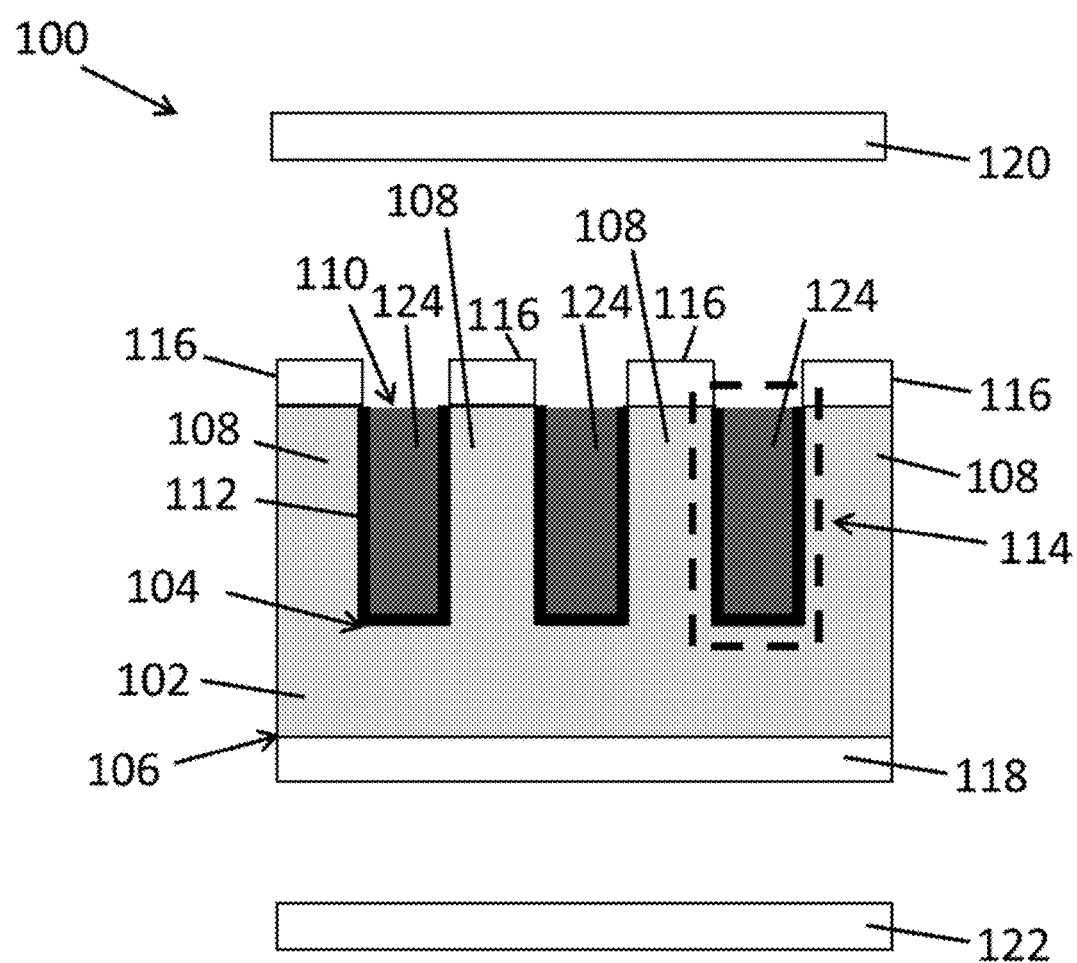
FIG. 10 is a schematic representation of an exemplary device as disclosed herein.
Figure 11:
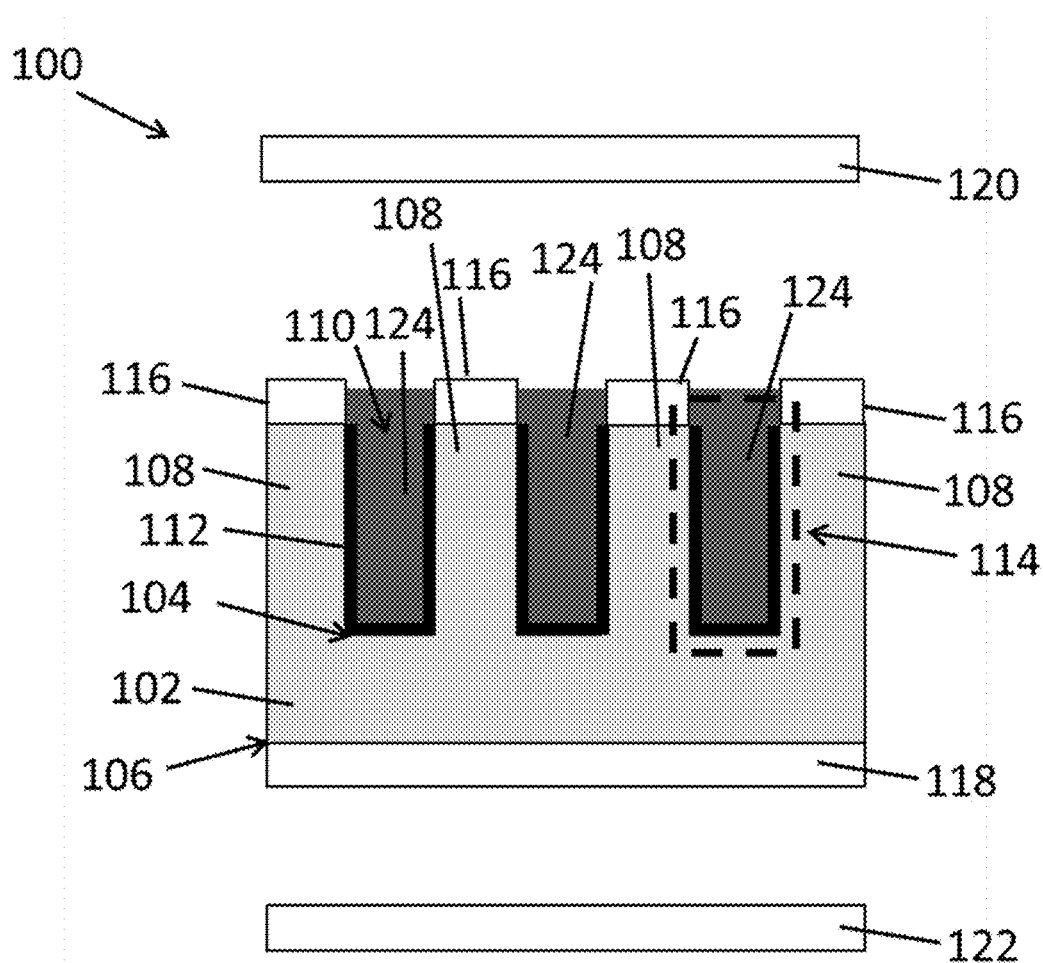
FIG. 11 is a schematic representation of an exemplary device as disclosed herein.

Referring now to FIG. 9, in some examples the device 100 can further comprise a scintillating material 124 disposed within at least a portion of the plurality of coated cavities 114. In some examples, each of the plurality of coated cavities 114 can be uniformly filled with the scintillating material 124 relative to the other plurality of coated cavities 114. In some examples, each of the plurality of coated cavities 114 can be completely filled with the scintillating material 124, for example as shown in FIG. 10. In some examples, the plurality of coated cavities 114 can be overfilled with the scintillating material 124, for example as shown in FIG. 11.

Figure 12:
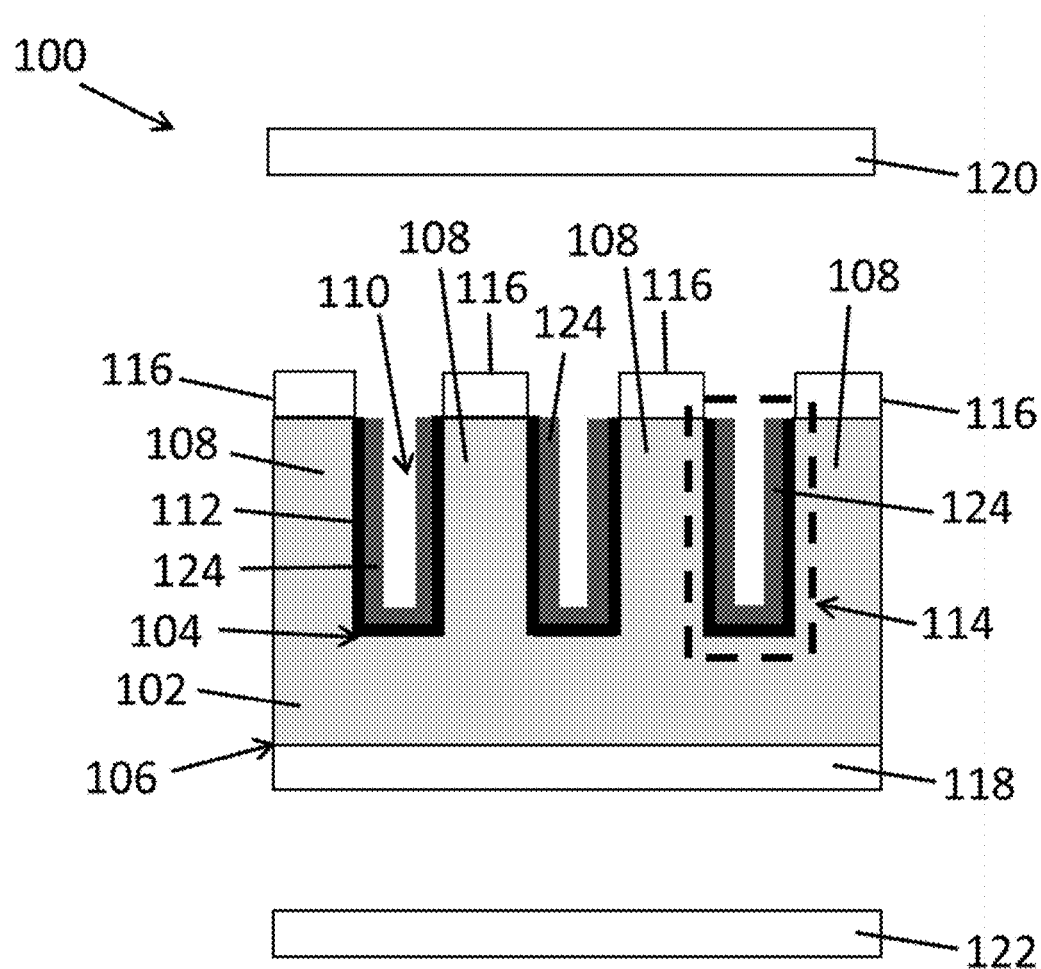
FIG. 12 is a schematic representation of an exemplary device as disclosed herein.

Referring now to FIG. 12, in some examples, the device 100 can further comprise a layer of a scintillating material 124 disposed on the radioactive layer 112, such that the plurality of coated cavities 114 are substantially coated by the layer of scintillating material 124.

The scintillating material 124 can, for example, be selected from the group consisting of a ZnS-based phosphor, CsI, thallium-doped sodium iodide (Tl:NaI), cerium-doped lutetium yttrium orthosilicate (Ce:Lu$_{1.8}$Y$_{0.2}$SiO$_5$, LYSO), bismuth germanate (Bi$_4$Ge$_3$O$_{12}$, BGO), plastic, CeF$_3$, europium doped calcium fluoride (Eu:CaF$_2$), PbWO$_4$, CdWO$_4$, cerium doped cesium lithium yttrium chloride (Ce:Cs$_2$LiYCl$_6$, CLYC), Ce:LaCl$_3$, CeBr$_3$, Ce:LaBr$_3$, praseodymium doped lutetium aluminum garnet (Pr:Lu$_3$Al$_5$O$_{12}$, Pr:LuAG), cerium doped lutetium aluminum perovskite (Ce:LuAlO$_3$, Ce:LuAP), Ce:Lu$_3$Al$_5$O$_{12}$, cerium doped yttrium orthosilicate (Ce:Y$_2$SiO$_5$, Ce:YSO), cerium doped yttrium aluminum perovskite (Ce:YAlO$_3$; Ce:YAP), cerium doped yttrium aluminum garnet (Ce:Y$_3$Al$_5$O$_{12}$, Ce:YAG), and combinations thereof. In some examples, the scintillating material 124 can perform as an energy degrader.

In some examples, the scintillating material 124 can comprise a radioactive material such that photons can be generated directly from within the scintillating material 124 upon exposure to radiation. For example, Na and I in Tl:NaI could be $^{22}$Na or $^{131}$I to form Tl:$^{22}$NaI, Tl:Na$^{131}$I, or Tl:$^{22}$Na$^{131}$I. $^{22}$Na undergoes beta+ decay, emitting positron and gamma rays, which can inject energy into the plurality of spaced-apart three-dimensional structures and/or the substrate to generate charge or electricity and can also produce photons within Tl:NaI, subsequently injecting energy into the plurality of spaced-apart three-dimensional structures and/or the substrate to generate charge or electricity.

Figure 13:
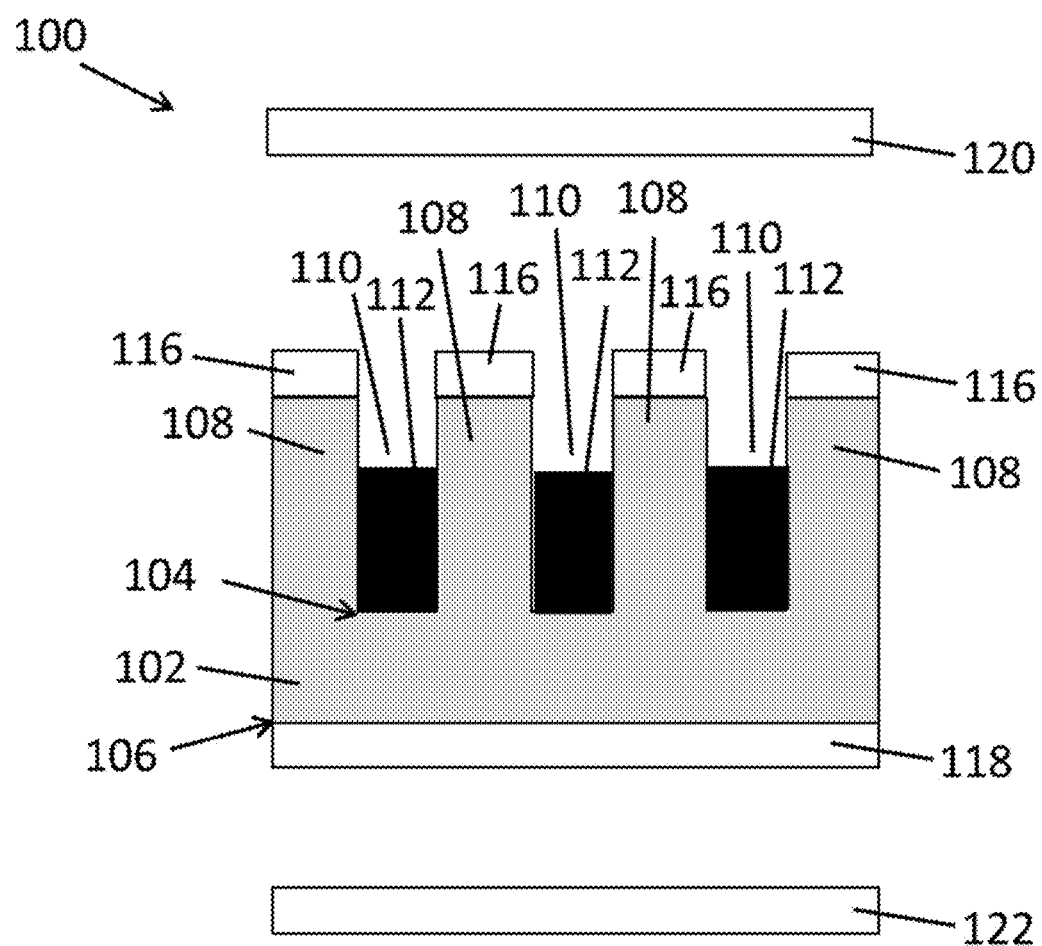
FIG. 13 is a schematic representation of an exemplary device as disclosed herein.

Referring now to FIG. 13, also disclosed herein are charge generating devices comprising: a substrate 102 having a top surface 104 and a bottom surface 106; a plurality of spaced-apart three-dimensional elements 108 disposed on the top surface 104 of the substrate 102; a plurality of cavities 110 formed by the plurality of spaced-apart three-dimensional elements 108, the plurality of cavities 110 being the area between the plurality of spaced-apart three-dimensional elements 108; a radioactive material 112 disposed within at least a portion of the plurality of cavities 110, thereby forming a plurality of at least partially filled cavities 110; a first conducting layer 116 disposed above the plurality of at least partially filled cavities 110 and the plurality of spaced-apart three-dimensional elements 108, wherein the first conducting layer 116 is in electric contact with the plurality of spaced-apart three-dimensional elements 108; a second conducting layer 118 disposed below the substrate 102, wherein the second conducting layer 118 is in electric contact with the bottom surface 106 of the substrate 102; a first scintillation layer 120 disposed above the first conducting layer 116 and in radiative contact with the first conducting layer 116; and a second scintillation layer 122 disposed below the second conducting layer 118 and in radiative contact with the second conducting layer 118. In some examples, the plurality of spaced-apart three-dimensional elements 108 are integrally formed with the substrate 102.

Figure 14:
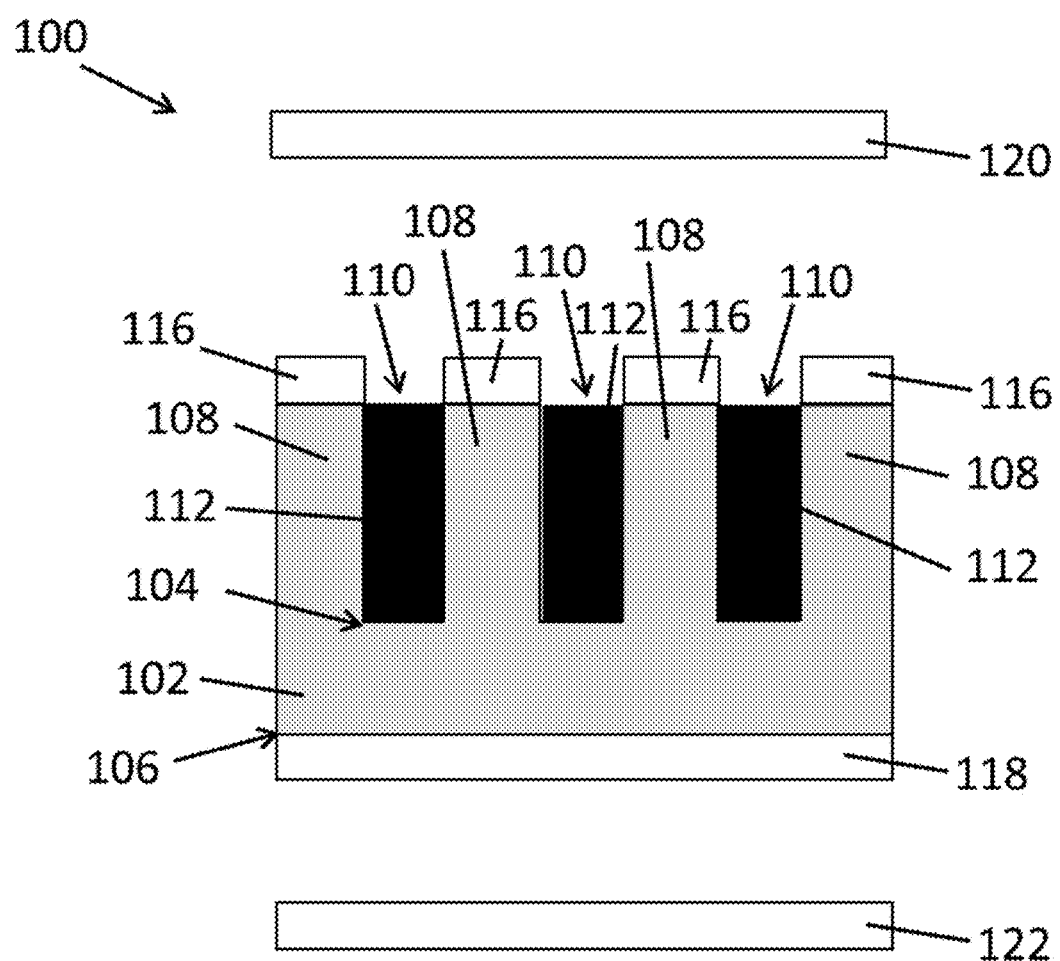
FIG. 14 is a schematic representation of an exemplary device as disclosed herein.
Figure 15:
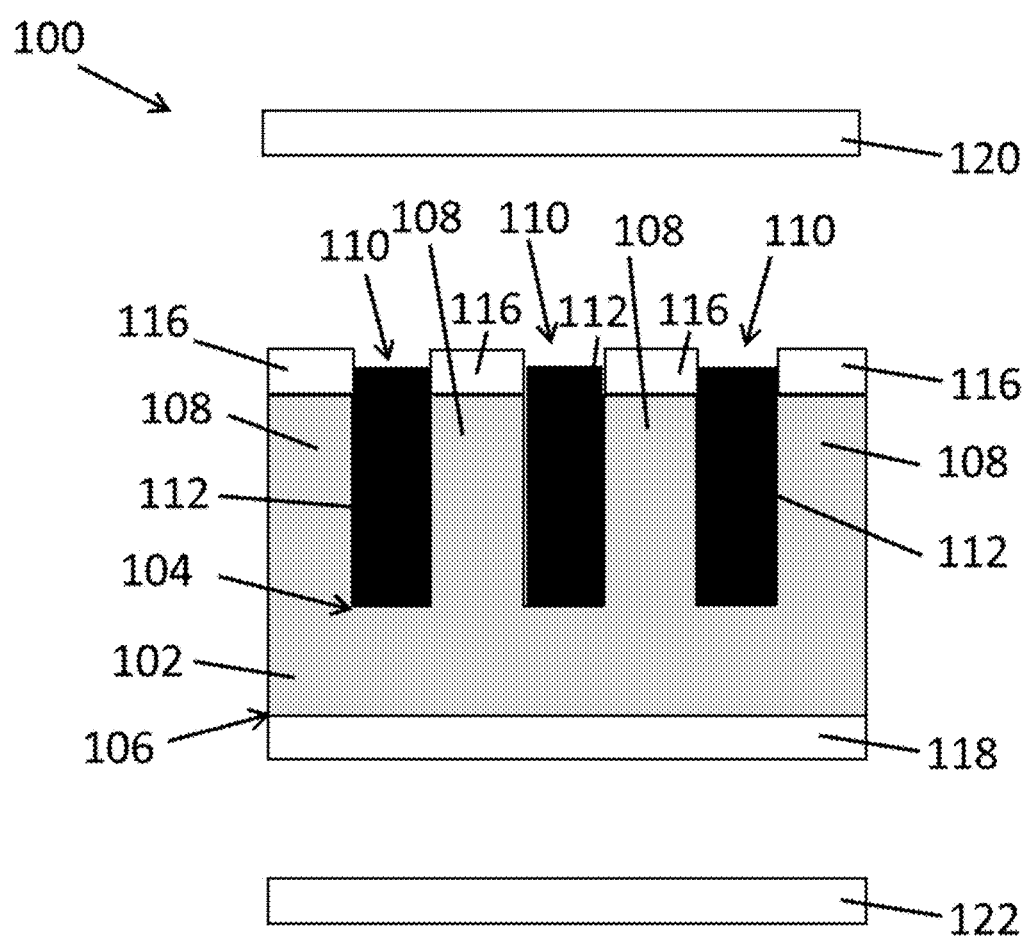
FIG. 15 is a schematic representation of an exemplary device as disclosed herein.

In some examples, each of the plurality of cavities 110 can be uniformly filled with the radioactive material 112 relative to the other plurality of cavities 110. In some examples, each of the plurality of cavities 110 can be completely filled with the radioactive material 112, for example as shown in FIG. 14. In some examples, the plurality of cavities 110 can be overfilled with the radioactive material 112, for example as shown in FIG. 15. The radioactive material 112 can, for example, comprise a powder comprising a radioisotope.

Figure 16:
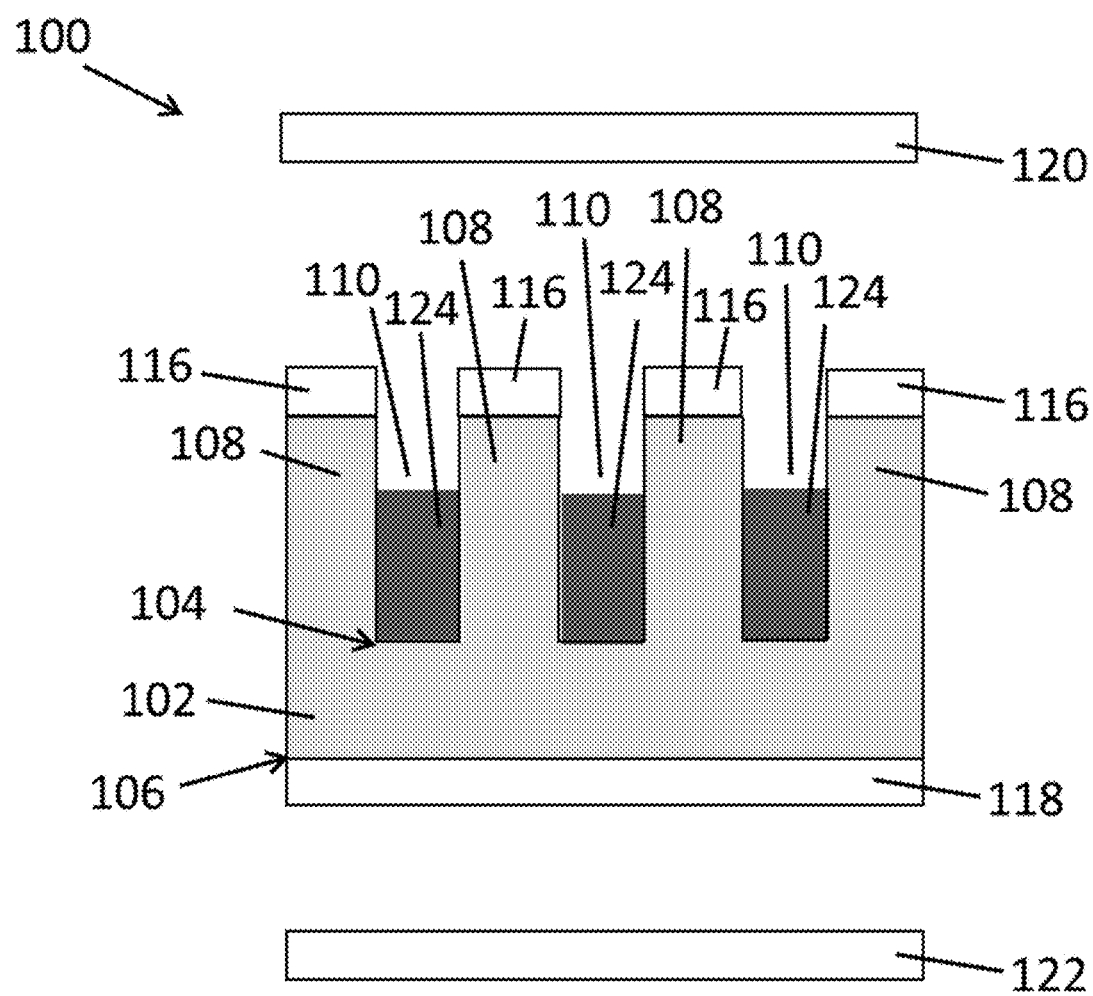
FIG. 16 is a schematic representation of an exemplary device as disclosed herein.

Referring now to FIG. 16, also disclosed herein are charge generating devices comprising: a substrate 102 having a top surface 104 and a bottom surface 106; a plurality of spaced-apart three-dimensional elements 108 disposed on the top surface 104 of the substrate 102; a plurality of cavities 110 formed by the plurality of spaced-apart three-dimensional elements 108, the plurality of cavities 110 being the area between the plurality of spaced-apart three-dimensional elements 108; a scintillating material disposed within at least a portion of the plurality of cavities 110, thereby forming a plurality of at least partially filled cavities 110; a first conducting layer 116 disposed above the plurality of at least partially filled cavities 110 and the plurality of spaced-apart three-dimensional elements 108, wherein the first conducting layer 116 is in electric contact with the plurality of spaced-apart three-dimensional elements 108; a second conducting layer 118 disposed below the substrate 102, wherein the second conducting layer 118 is in electric contact with the bottom surface 106 of the substrate 102; a first scintillation layer 120 disposed above the first conducting layer 116 and in radiative contact with the first conducting layer 116; and a second scintillation layer 122 disposed below the second conducting layer 118 and in radiative contact with the second conducting layer 118. In some examples, the plurality of spaced-apart three-dimensional elements 108 are integrally formed with the substrate 102.

Figure 17:
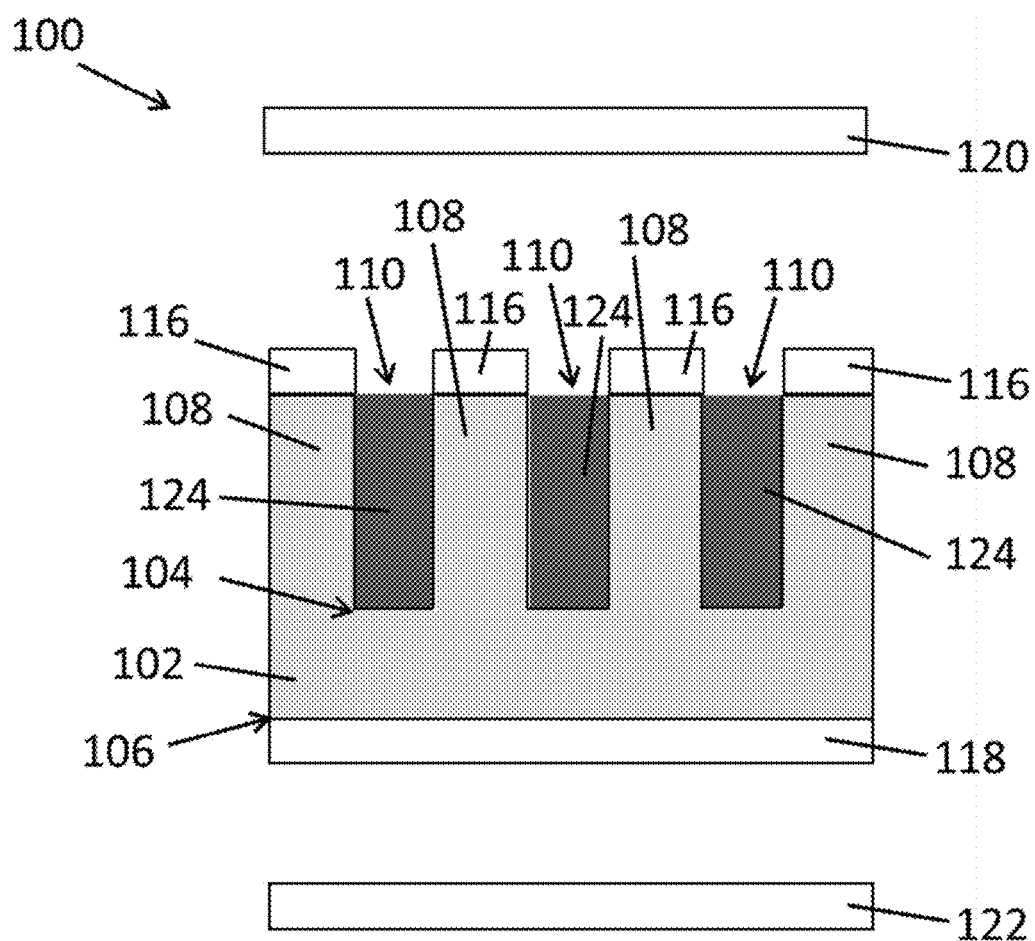
FIG. 17 is a schematic representation of an exemplary device as disclosed herein.
Figure 18:
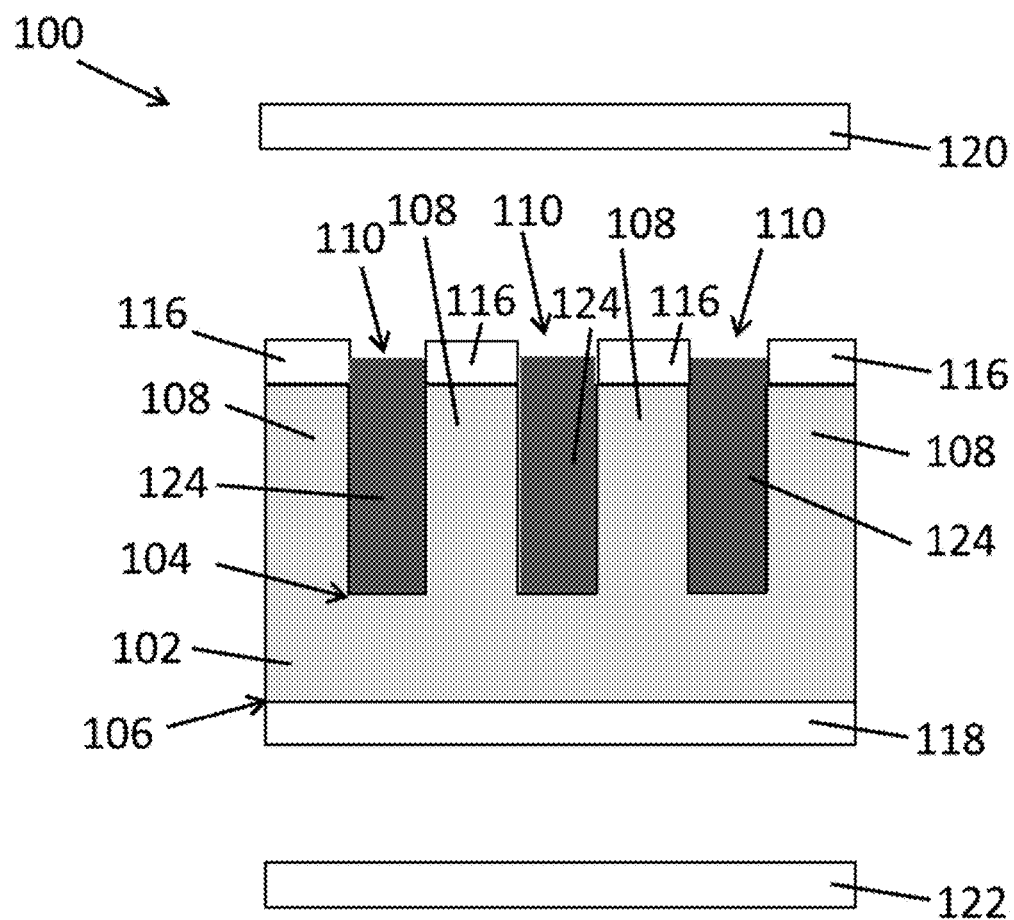
FIG. 18 is a schematic representation of an exemplary device as disclosed herein.

In some examples, each of the plurality of cavities 110 can be uniformly filled with the scintillating material 124 relative to the other plurality of cavities 110. In some examples, each of the plurality of cavities 110 can be completely filled with the scintillating material 124, for example as shown in FIG. 17. In some examples, the plurality of cavities 110 can be overfilled with the scintillating material 124, for example as shown in FIG. 18.

Figure 19:
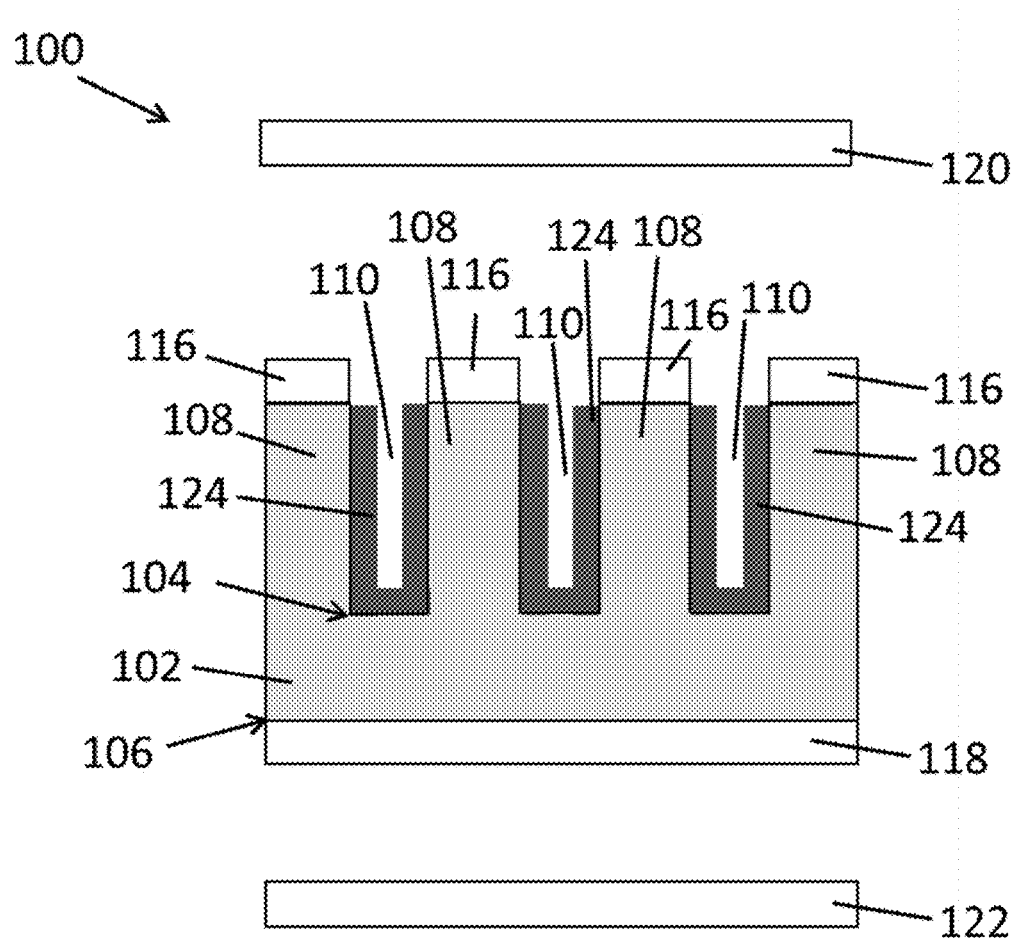
FIG. 19 is a schematic representation of an exemplary device as disclosed herein.

Referring now to FIG. 19, in some examples, the scintillating material 124 is disposed as a layer on the plurality of spaced-apart three-dimensional elements 108, such that the first conducting layer 116 is in electric contact with the plurality of spaced-apart three-dimensional elements 108 through the layer of the scintillating material 124.

In some examples, the device 100 can further comprise a radioactive layer 112 disposed on at least a portion of the plurality of spaced-apart three-dimensional elements 108 and the top surface 104 such that the plurality of cavities 110 and the top surface 104 are substantially coated by the radioactive layer 112, thereby forming a plurality of coated cavities 114 such that the scintillating material is disposed within at least a portion of the plurality of coated cavities 114, for example as described above and shown in FIG. 9-FIG. 11.

The devices 100 can further include and/or be coupled to additional components. For example, the devices 100 can further comprise a charge storage device electrically coupled to the first conducting layer and the second conducting layer.

In some examples, multiple devices 100 can be electrically coupled together.

Methods of Making

Also disclosed herein are methods of making the devices disclosed herein. For example, the methods can comprise forming the plurality of spaced-apart three-dimensional elements on the top surface of the substrate; and depositing the radioactive layer on at least a portion of the plurality of spaced-apart three-dimensional elements and the top surface such that the plurality of cavities and the top surface are substantially coated by the radioactive layer, thereby forming the plurality of coated cavities.

Forming the plurality of spaced-apart three-dimensional elements on the top surface of the substrate can, for example, comprise a top-down or a bottom-up approach. In some examples, forming the plurality of spaced-apart three-dimensional elements can comprise a top down approach, such as etching a portion of the substrate to thereby form the plurality of cavities, and thus also forming the plurality of spaced-apart three-dimensional elements on the substrate where the spaced-apart three-dimensional elements are integrally formed with the substrate.

Depositing the radioactive layer can, for example, comprise electrodeposition, printing, lithographic deposition, spin coating, drop-casting, zone casting, dip coating, blade coating, spraying, vacuum filtration, slot die coating, curtain coating, or combinations thereof.

In some examples, wherein the device further comprises a scintillating material disposed within at least a portion of the plurality of coated cavities, the method further comprises depositing the scintillating material within at least a portion of the plurality of coated cavities. In some examples, therein the scintillating material comprises a radioactive scintillating material, the method further comprises depositing the radioactive scintillating material within at least a portion of the plurality of coated cavities. Depositing the scintillating material and/or the radioactive scintillating material can, for example, comprise electrodeposition, printing, lithographic deposition, spin coating, drop-casting, zone casting, dip coating, blade coating, spraying, vacuum filtration, slot die coating, curtain coating, or combinations thereof.

Figure 20:
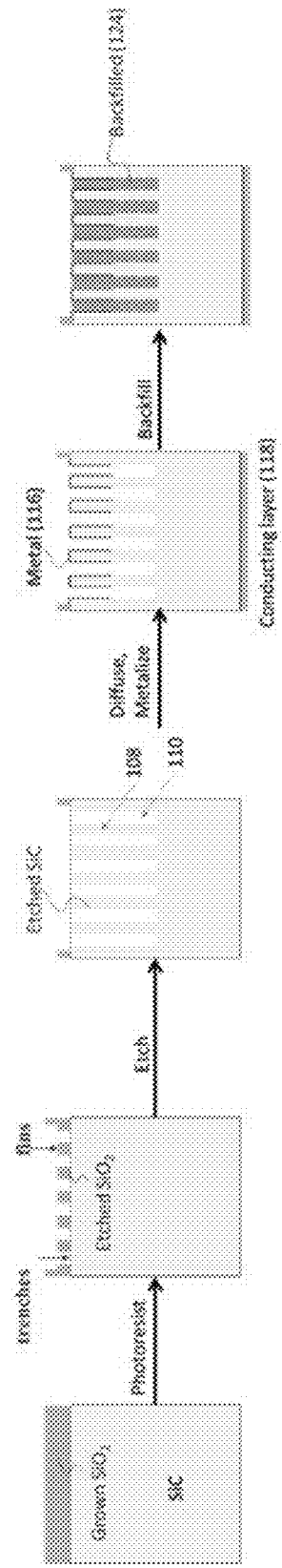
FIG. 20 is a schematic representation of a method of making an exemplary device as disclosed herein.

A schematic diagram of an exemplary method of making a device is shown, for example, in FIG. 20.

In some examples, the methods of making the device can comprise forming the plurality of spaced-apart three-dimensional elements on the top surface of the substrate; and depositing the scintillating material within at least a portion of the plurality of cavities.

Methods of Use

Also provided herein are methods of use of the devices described herein. The devices described herein can, for example, be used to convert radiation to electricity. The devices described herein can convert radiation to electricity with an efficiency of 10% or more (e.g., 15% or more, 20% or more, 25% or more, or 30% or more). In some examples, the devices described herein can convert radiation to electricity with an efficiency of from 25% to 35%.

The devices can be used in various articles of manufacture, such as, for example, electronic devices, energy conversion devices, optical devices, optoelectronic devices, or combination thereof. Examples of articles of manufacture using the devices described herein can include, but are not limited to solar cells, fuel cells, photovoltaic cells, sensors, devices used in the Internet of Things (IoT), and combinations thereof. Such articles of manufacture can be fabricated by methods known in the art.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Figure 21:
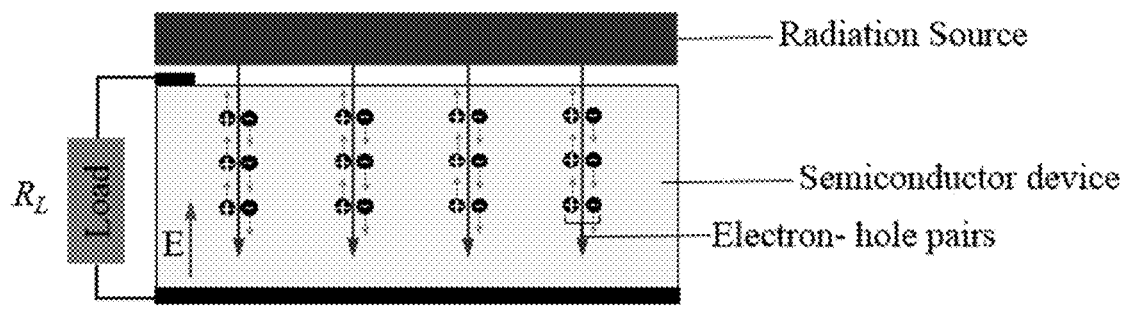
FIG. 21 is a schematic diagram of a nuclear battery.

Nuclear voltaic batteries are devices that use energy from the decay of radioactive isotopes to generate electricity. Nuclear batteries have a longer battery life compared to traditional chemical batteries. A schematic diagram of a nuclear battery is shown in FIG. 21. As shown in FIG. 21, when emitted particles (e.g., alpha particles, beta particles, photons) from the radioactive source interact with matter, the ionizing radiation crease electron-hole pairs in a semiconductor in the nuclear battery. The electron-hole pairs in the depletion region and near the depletion region can be separated by the built-in voltage of the nuclear battery. The separated electron-hole pairs can then diffuse and move to the electrodes to then be delivered to an external circuit.

Because nuclear batteries have a longer battery life compared to traditional chemical batteries, they are attractive for many applications such as outer space exploration, in implantable medical devices (IMD) (e.g., deep brain neurostimulators, cochlear implants, gastric stimulators, cardiac defibrillators, pacemakers, foot drop implants, insulin pumps, etc.), and applications that involve harsh environment operation of the battery. For example, for outer space exploration applications, only a small percentage of sunlight reaches the outer perimeter of the solar system making solar power unfeasible. Furthermore, it is almost impossible to access the devices for outer space exploration once launched, therefor the device must function reliably over a long period of time without being accessed for recharge or maintenance. Similarly, for many implantable medical devices it can be difficult and/or dangerous to access the devices once implanted, therefor the device must function reliably over a long period of time without being accessed for recharge or maintenance. For both space exploration and implantable medical devices, it is further desirable for the power source to be small in size. Chemical batteries can malfunction when operated in an environment that is high in temperature, high in humidity, and/or high in radiation; nuclear batteries can be more stable under such harsh operating conditions.

Traditional nuclear batteries currently suffer from a few challenges, such as low power conversion efficiency, small power output, and radiation damage to the semiconductor device. The wide band gap semiconductor materials used in traditional nuclear batteries theoretically have a small leakage current which can contribute to the low power conversion efficiency and low power output.

A device with a large mean free path of the carrier can increase the number of electron-hole pairs that can be collected, and thus improve the performance of the nuclear battery. Further, a device using materials with a high atomic displacement energy, such as SiC, GaN, and diamond, can be resistant to radiation damage and can therefore improve the lifetime and efficiency of the device. Additionally, a device using materials which high thermal conductivity, such as SiC, can maintain stable working conditions even in a high temperature environment (optionally with extra cooling used).

Figure 22:
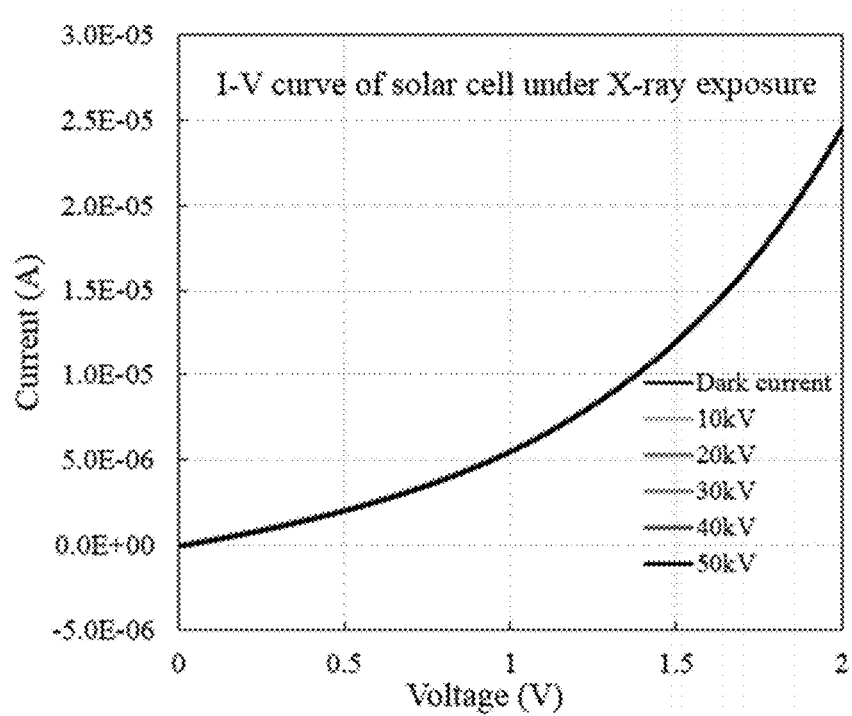
FIG. 22 shows the I-V curve for the X-ray response under voltaic mode of a commercial Si solar cell with an X-ray tube having a maximum power of 3.95 W as the radiation source. The X-ray tube power was adjusted by changing the voltage while the current was set to 79 μA.
Figure 23:
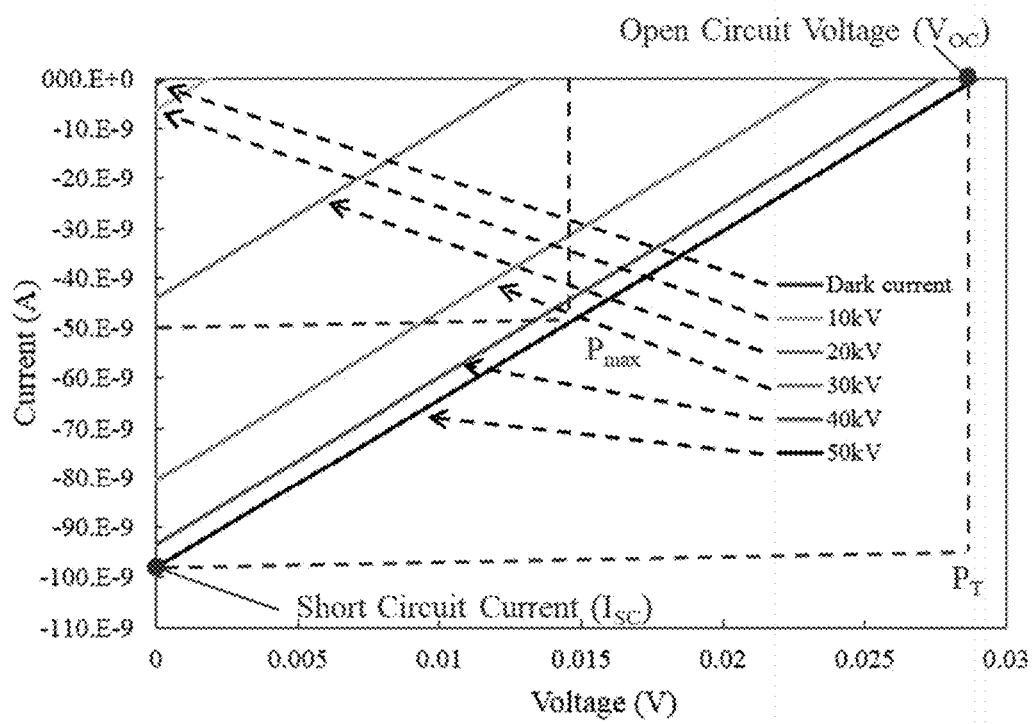
FIG. 23 shows a magnified view of a portion of FIG. 22.

The X-ray response under voltaic mode of a commercial Si solar cell with an X-ray tube having a maximum power of 3.95 W as the radiation source is shown in FIG. 22, with a magnified view of further shown in FIG. 23. The X-ray tube power was adjusted by changing the voltage while the current was set to 79 µA. The fill factor can be calculated from the I-V curve according to:

$$\text{Fill Factor} = \frac{P_{MAX}}{P_T} = \frac{I_{MP} \times V_{MP}}{I_{SC} \times V_{OC}}$$

where $P_T$, $P_{MAX}$, $V_{OC}$, and $I_{SC}$ are shown schematically in FIG. 23.

Figure 24:
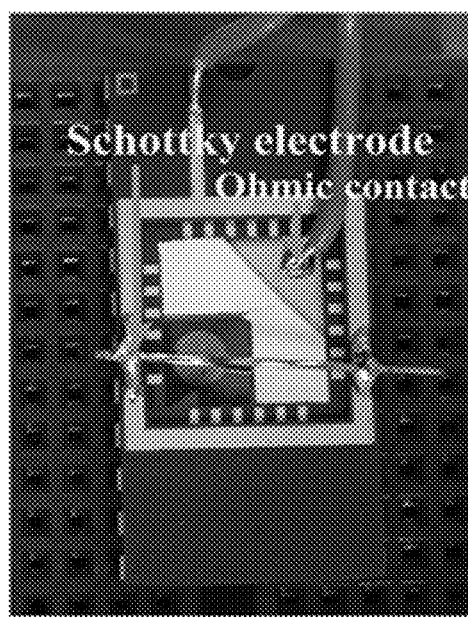
FIG. 24 is an image of a packaged device in a dual in-line chip carrier comprising a Schottky electrode and an Ohmic contact.
Figure 25:
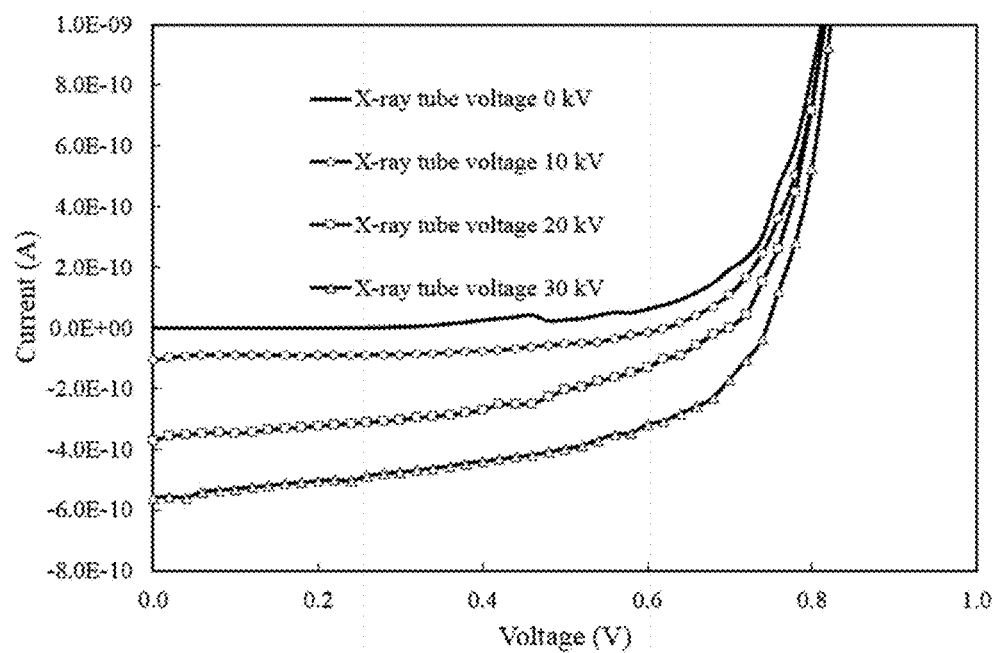
FIG. 25 is the I-V curve for the X-ray response under voltaic mode of a SiC Schottky diode.

A packaged device in a dual in-line chip carrier comprising a Schottky electrode and an Ohmic contact is shown in FIG. 24. The X-ray response under voltaic mode of a SiC Schottky diode is shown in FIG. 25.

Figure 26:
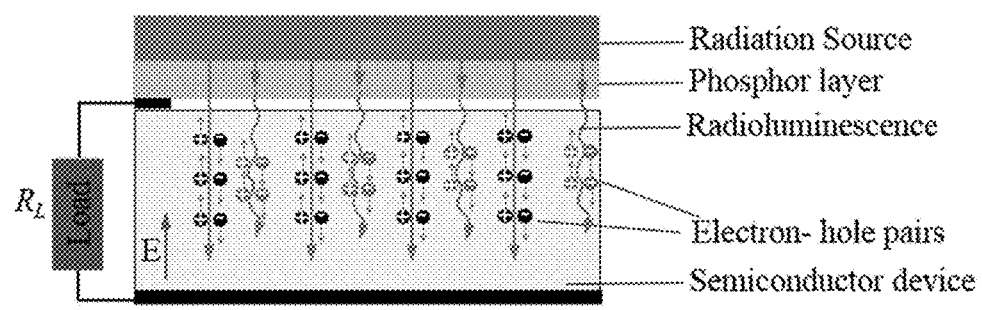
FIG. 26 is a schematic diagram of a nuclear battery with a thin scintillator layer positioned between the radiation source and the semiconductor for an improved power conversion efficiency.

A thin scintillator layer positioned between the radiation source and the semiconductor in a nuclear battery, as shown in FIG. 26, can generate light for an improved power conversion efficiency.

Figure 27:
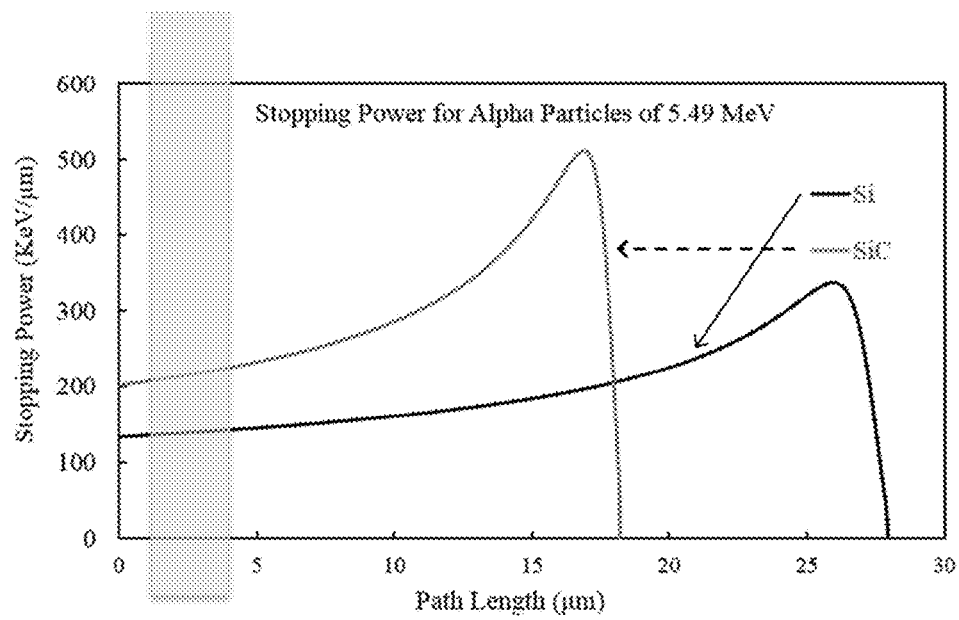
FIG. 27 shows the stopping power for alpha particles of 5.49 MeV for Si and SiC.
Figure 28:
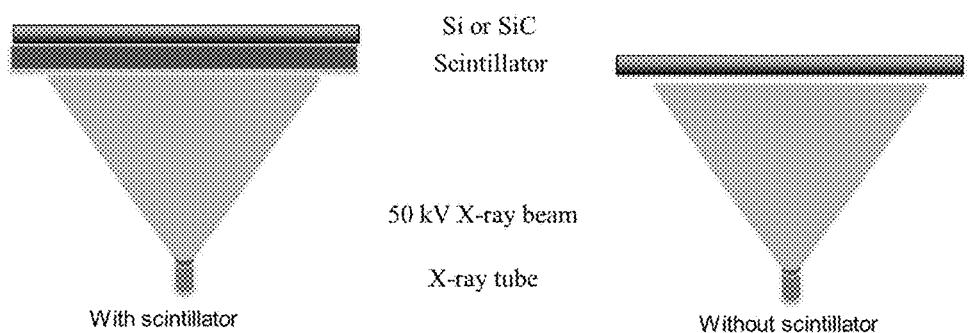
FIG. 28 shows a schematic diagram of a test setup for adding a thin layer of a scintillator. Without the scintillator, the device relies on direct detection, whereas with the scintillator the device can use combined direct and indirect detection.

The stopping power for alpha particles of 5.49 MeV for Si and SiC is shown in FIG. 27. A thin phosphor layer (e.g., scintillator layer) can decrease the particle energy for a higher stopping power, matching up with the device length scale (e.g., ~1 µm). Without the scintillator, the device relies on direct detection, whereas with the scintillator the device can use combined direct and indirect detection, as shown schematically in FIG. 28. The device with the scintillator layer can, for example, further include a metal layer between the scintillator and semiconductor which can block the photons from the scintillator, as shown schematically in FIG. 29.

Figure 29:
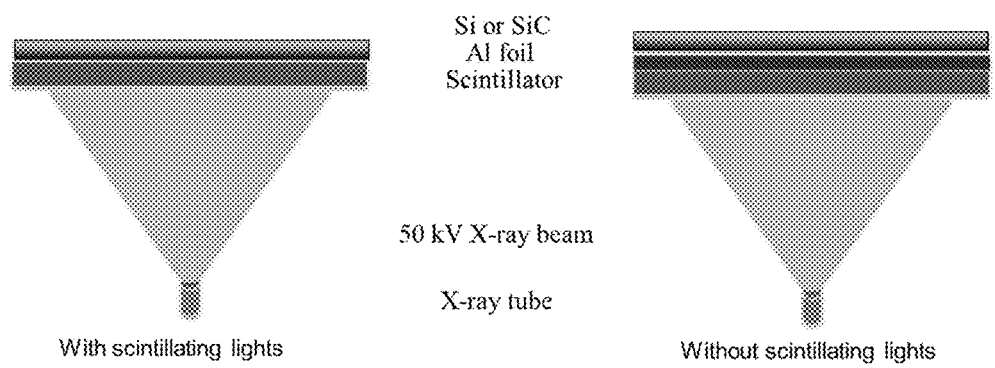
FIG. 29 shows a schematic diagram of a test setup for adding a metal layer between the thin layer of scintillator and the semiconductor. The metal layer between the scintillator and semiconductor can, for example, block the photons from the scintillator.
Figure 30:
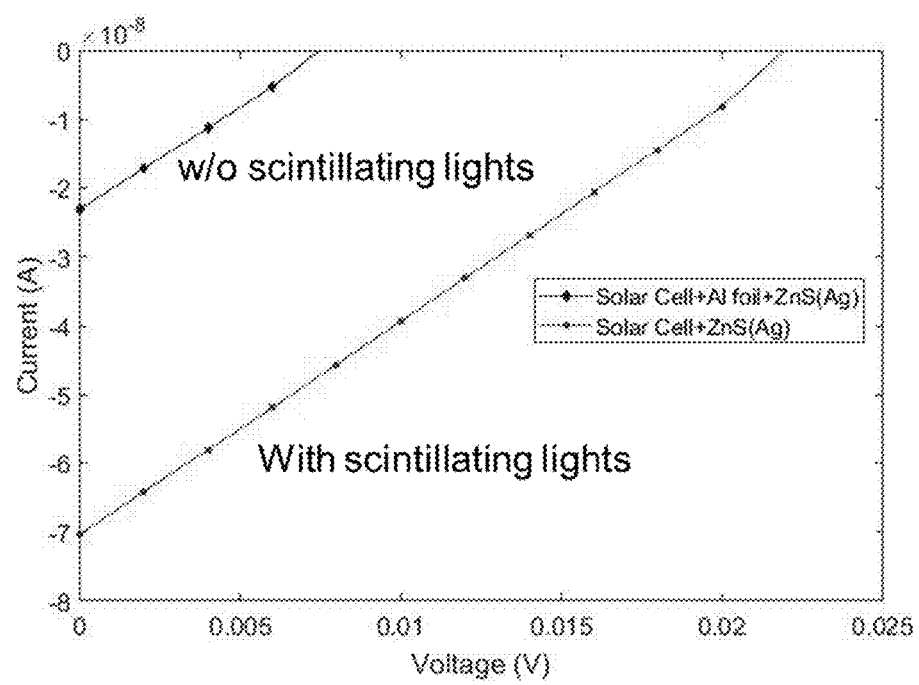
FIG. 30 shows the power output for the devices shown schematically in FIG. 29 comprising a solar cell and a thin layer of ZnS(Ag) as a scintillator or comprising a solar cell, an aluminum foil layer, and a thin layer of ZnS(Ag).

The power output for devices shown schematically in FIG. 29 comprising a solar cell and a thin layer of ZnS(Ag) as a scintillator or comprising a solar cell, an aluminum foil layer, and a thin layer of ZnS(Ag) is shown in FIG. 30. Compared to the devices without a scintillator, the power output increased 787% by adding ZnS(Ag).

Figure 31:
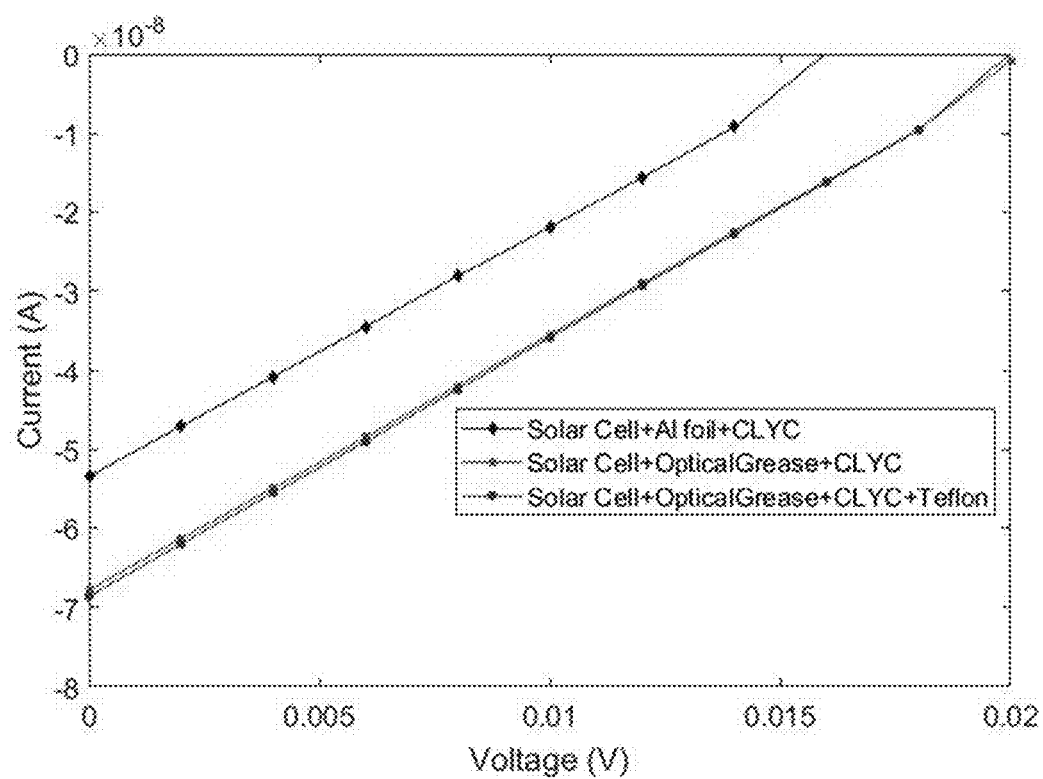
FIG. 31 shows the power output for devices shown schematically in FIG. 29 comprising a solar cell, an aluminum foil layer, and a thin layer of CLYC (cerium doped cesium lithium yttrium chloride ($Ce:Cs_2LiYCl_6$) as the scintillator; a solar cell, a layer of optical grease, and a thin layer of CLYC (cerium doped cesium lithium yttrium chloride ($Ce:Cs_2LiYCl_6$) as the scintillator; and a solar cell, a layer of optical grease, a thin layer of CLYC (cerium doped cesium lithium yttrium chloride ($Ce:Cs_2LiYCl_6$) as the scintillator; and a Teflon reflector.

The power output for devices shown schematically in FIG. 29 comprising a solar cell, an aluminum foil layer, and a thin layer of CLYC (cerium doped cesium lithium yttrium chloride (Ce:Cs$_2$LiYCl$_6$) as the scintillator; a solar cell, a layer of optical grease, and a thin layer of CLYC (cerium doped cesium lithium yttrium chloride (Ce:Cs$_2$LiYCl$_6$) as the scintillator; and a solar cell, a layer of optical grease, a thin layer of CLYC (cerium doped cesium lithium yttrium chloride (Ce:Cs$_2$LiYCl$_6$) as the scintillator; and a Teflon reflector is shown in FIG. 31. The power output increase ~58% by adding CLYC. The power output increased an additional ~1% after adding a Teflon reflector.

The photon emission spectra properties of various scintillators are described below in Table 1. When compared to the External Quantum Efficiency (EQE) of a Si solar cell and SiC, it can be seen that the photons emitted from ZnS(Ag) match well with a Si solar cell, but none of the three phosphors described in Table 1 match well with SiC since the emission photons of the scintillators are too low in energy to include a noticeable power increase. Deep UV emission scintillators with high light yield would need to be applied to SiC to enhance the efficiency.

TABLE 1

Photon emission properties of ZnS(Ag), CLYC, and polyvinyltoluene (PVT).

|  | ZnS(Ag) | CLYC | PVT |
| --- | --- | --- | --- |
| Peak emission wavelength (nm) | 450 | 370 | 435 |
| Corresponding energy (eV) | 2.75 | 3.35 | 2.85 |
| Scintillator light yield (Photons/MeV) | 58,500 | 20,000 | 9,000 |

An alpha voltaic battery based on a Si semiconductor device was designed and fabricated. An alpha voltaic device potentially has a higher output power as alpha particles have higher relative energy than beta particles. Further, an alpha voltaic device can be smaller in size and easier to shield. However, the higher energy alpha particles will degrade materials faster than the lower energy beta particles.

Figure 32:
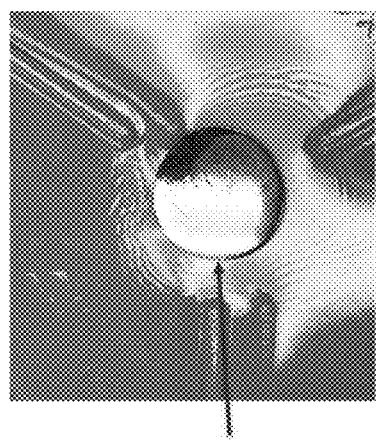
FIG. 32 shows the customized 4 μCi Am-241 source with a diameter of 17.9 mm that was used as the alpha source in an alpha voltaic batter based on a Si device.
Figure 33:
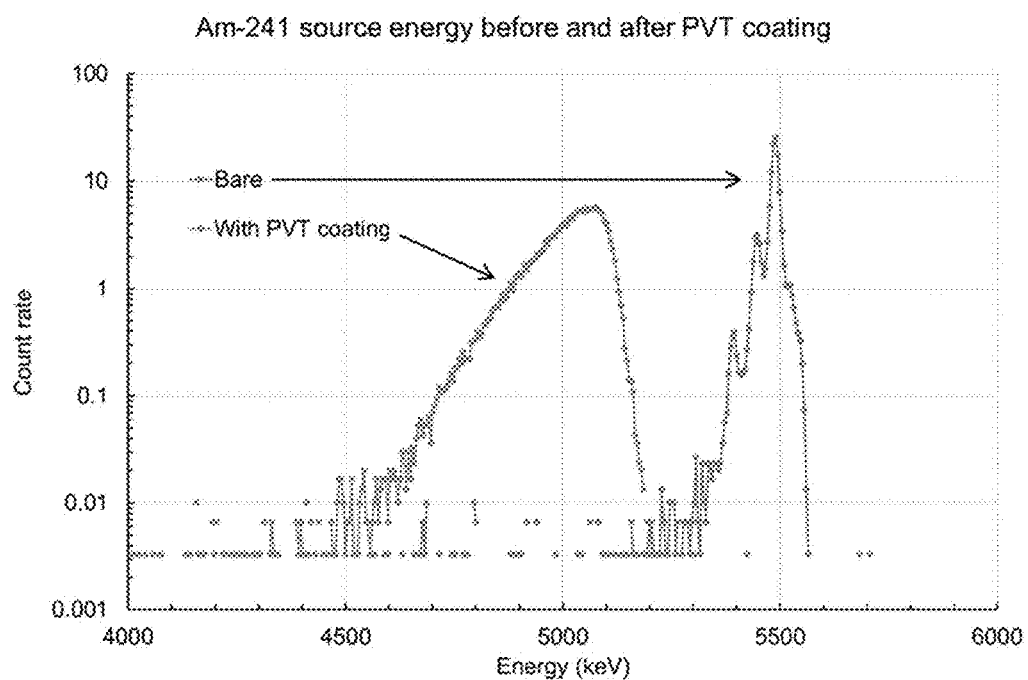
FIG. 33 shows the energy of the Am-241 source before and after PVT coating.
Figure 34:
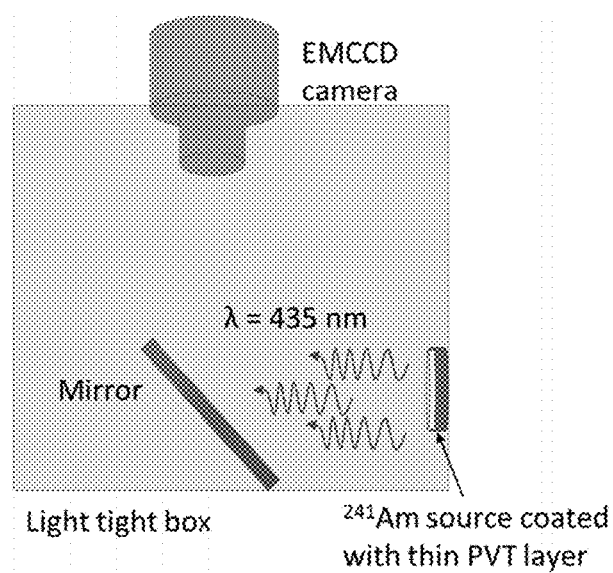
FIG. 34 is a schematic diagram of how the EMCCD camera was used for emission photon imaging of the PVT-coated Am-241 source to determine if there were any alpha induced photons.
Figure 35:
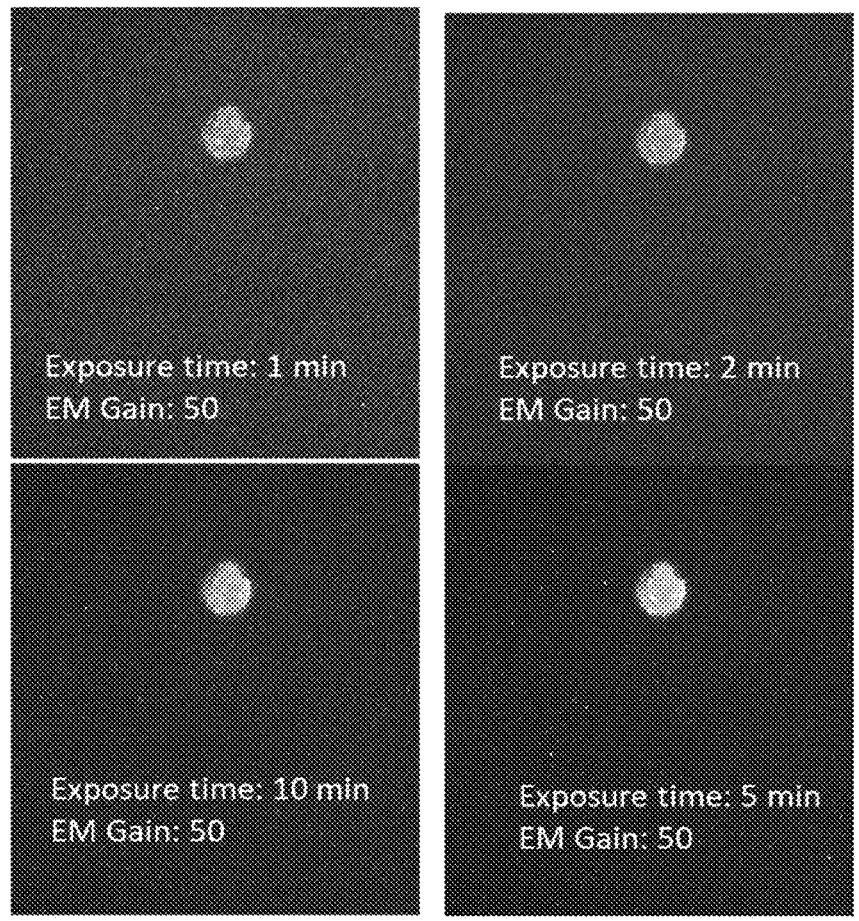
FIG. 35 shows the photon emission imaging of the PVT-coated Am-241 source using the EMCCD camera.

A customized 4 µCi Am-241 source was used as the alpha source in the device (diameter 17.9 mm, FIG. 32). Further, PVT was coated on the alpha source as a scintillator and energy degrader (FIG. 33). An EMCCD camera was used for emission photon imaging of the PVT-coated Am-241 source to determine if there were any alpha induced photons (FIG. 34-FIG. 35).

Figure 36:
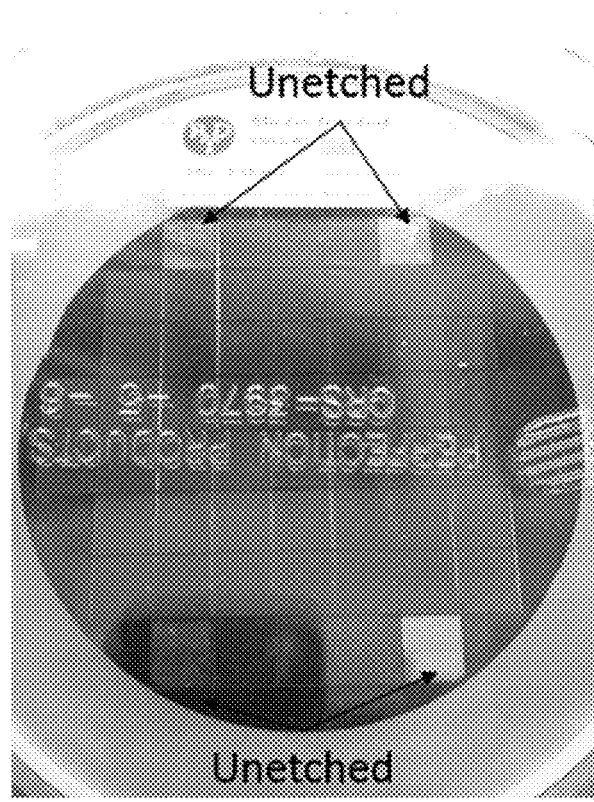
FIG. 36 is an image of an unetched device (2D).
Figure 37:
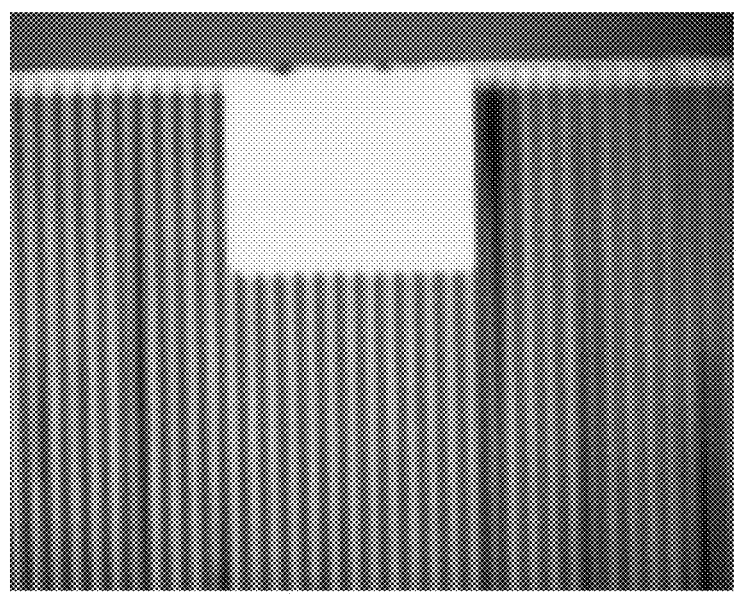
FIG. 37 is a microscopic image of the front side of the unetched device (2D) from FIG. 36.
Figure 38:
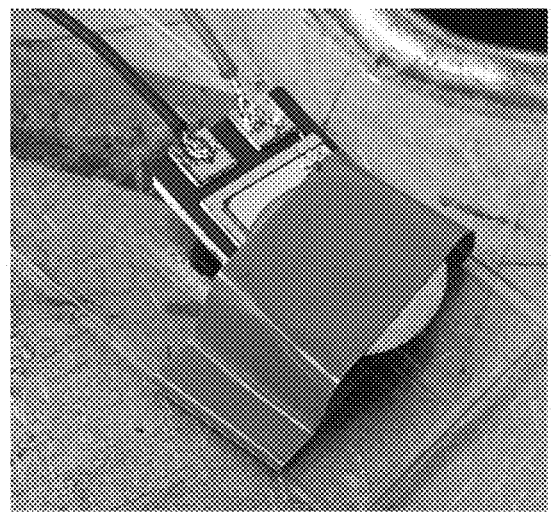
FIG. 38 is an image of the 2D Si device partially covered by the Am-241 source.
Figure 39:
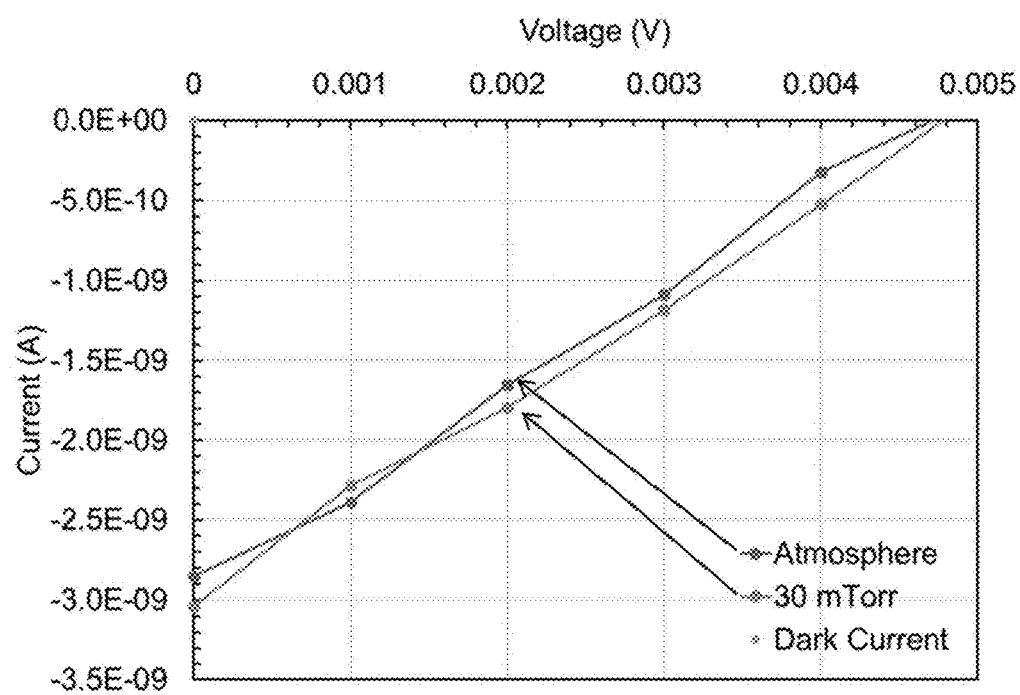
FIG. 39 shows the 2D Si p-n diode response to the Am-241 source t atmosphere and at 30 mTorr. When the Am-241 source was applied to the unetched 2D Si device, the device's maximum power output at atmosphere was about 3.3 pW and at 30 mTorr was about 3.59 pW with about 70% of the area of the 2D Si device covered by the Am-241 source.

Additionally, 2D and 3D Si p-n diodes were investigated. Images of an unetched device (2D) are shown in FIG. 36 and FIG. 37. The 2D Si device was partially covered by the Am-241 source (FIG. 38). The 2D Si p-n diode response to the Am-241 source was tested (FIG. 39). When the Am-241 source was applied to the unetched 2D Si device, the device's maximum power output at atmosphere was about 3.3 pW and at 30 mTorr was about 3.59 pW with about 70% of the area of the 2D Si device covered by the Am-241 source.

Figure 40:
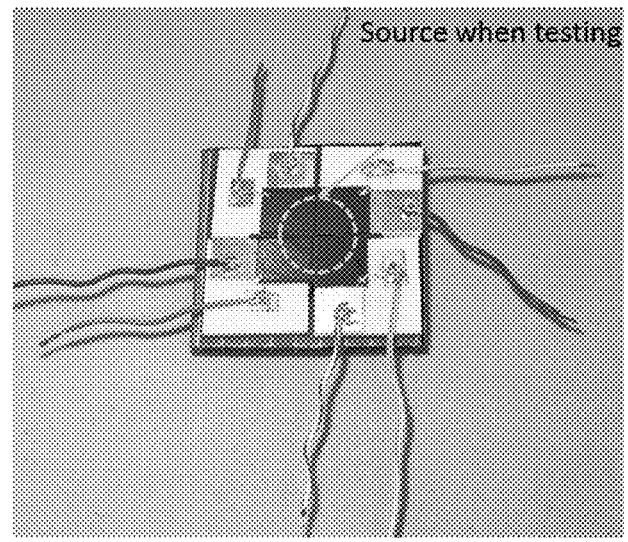
FIG. 40 shows an image of a 3D device array test set up.
Figure 41:
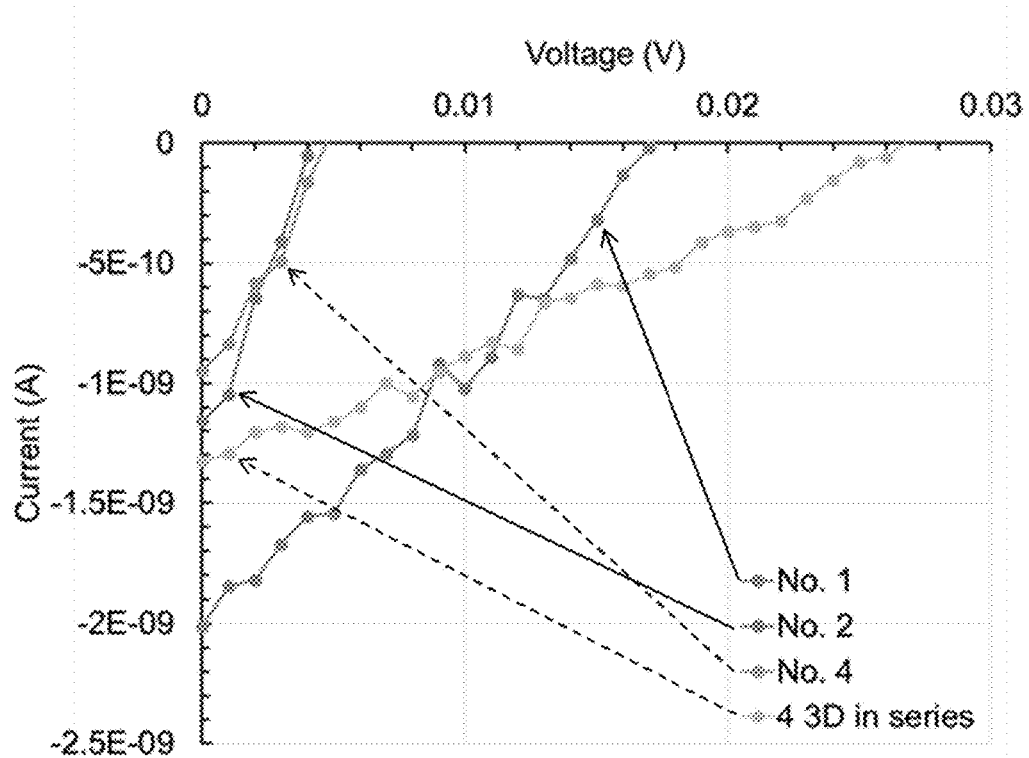
FIG. 41 shows the power generation for the 3D device array test set up shown in FIG. 41 under various conditions.

A 3D etched device has a larger effect area than a 2D unetched device, which can theoretically yield higher efficiency. A 3D device array test set up was designed to utilize as much of the source area as possible (FIG. 40). During the test, the set up (FIG. 40) remained the same, but a different number of devices were connected to investigate the power generation (FIG. 41).

A discussed above, traditional nuclear batteries can suffer from a few challenges, such as low power conversion efficiency, small power output, and radiation damage to the semiconductor device. The devices described herein address these challenges through the use of a scintillator, 3D structures, and wide band-gap materials.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The devices and methods of the appended claims are not limited in scope by the specific devices and methods described herein, which are intended as illustrations of a few aspects of the claims. Any devices and methods that are functionally equivalent are intended to fall within the scope of the claims. Various modifications of the devices and methods in addition to those shown and described herein are intended to fall within the scope of the appended claims. Further, while only certain representative devices and methods disclosed herein are specifically described, other devices and methods also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

The term "comprising" and variations thereof as used herein is used synonymously with the term "including" and variations thereof and are open, non-limiting terms. Although the terms "comprising" and "including" have been used herein to describe various embodiments, the terms "consisting essentially of" and "consisting of" can be used in place of "comprising" and "including" to provide for more specific embodiments of the invention and are also disclosed. Other than where noted, all numbers expressing geometries, dimensions, and so forth used in the specification and claims are to be understood at the very least, and not as an attempt to limit the application of the doctrine of equivalents to the scope of the claims, to be construed in light of the number of significant digits and ordinary rounding approaches.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

Unless defined otherwise, all technical and scientific terms used herein have the same meanings as commonly understood by one of skill in the art to which the disclosed invention belongs. Publications cited herein and the materials for which they are cited are specifically incorporated by reference.

What is claimed is:

1. A charge generating device comprising:
   a substrate having a top surface and a bottom surface;
   a plurality of spaced-apart three-dimensional elements disposed on the top surface of the substrate;
   a plurality of cavities formed by the plurality of spaced-apart three-dimensional elements, the plurality of cavities being the area between the plurality of spaced-apart three-dimensional elements;
   a radioactive layer disposed on at least a portion of the plurality of spaced-apart three-dimensional elements and the top surface such that the plurality of cavities and the top surface are substantially coated by the radioactive layer, thereby forming a plurality of coated cavities;
   a first conducting layer disposed above the plurality of spaced-apart three-dimensional elements, wherein the first conducting layer is in electric contact with at least a portion of the plurality of spaced-apart three-dimensional elements;
   a second conducting layer disposed below the substrate, wherein the second conducting layer is in electric contact with the bottom surface of the substrate;
   a first scintillation layer disposed above the first conducting layer and in radiative contact with the first conducting layer; and
   a second scintillation layer disposed below the second conducting layer and in radiative contact with the second conducting layer.

2. The device of claim 1, wherein the plurality of spaced-apart three-dimensional elements are integrally formed with the substrate.

3. The device of claim 1, wherein the substrate and the plurality of spaced-apart three-dimensional elements comprise a wide band-gap semiconductor.

4. The device of claim 1, wherein the substrate and the plurality of spaced-apart three-dimensional elements comprise SiC, GaN, $Ga_2O_3$, diamond, GaAs, AlN, AlGaN, $Al_2O_3$, BN, AlAs, GaP, InP, $B_4C$, or a combination thereof.

5. The device of claim 1, wherein the substrate and the plurality of spaced-apart three-dimensional elements comprise SiC, $Ga_2O_3$, diamond, GaN, or $Al_2O_3$.

6. The device of claim 1, wherein each of the plurality of spaced-apart three-dimensional elements has an average characteristic dimension of from 0.5 micrometers (μm) to 500 μm.

7. The device of claim 1, wherein each of the plurality of spaced-apart three-dimensional elements has an average height of from 1 μm to 500 μm.

8. The device of claim 1, wherein the plurality of spaced-apart three-dimensional elements form an array and each of the plurality of spaced-apart three-dimensional elements is separated from its neighboring three-dimensional elements by a distance of from 1 μm to 500 μm (edge to edge).

9. The device of claim 8, wherein the plurality of spaced-apart three-dimensional elements form a rectangular array, a hexagonal array, or a linear array.

10. The device of claim 1, wherein the radioactive layer emits alpha radiation, beta radiation, gamma radiation, or a combination thereof.

11. The device of claim 1, wherein the radioactive layer emits alpha radiation.

12. The device of claim 1, wherein the radioactive layer comprises $^{148}Gd$, $^{238}Pu$, $^{208}Po$, $^{210}Po$ $^{243}Cm$, $^{244}Cm$, $^{241}Am$, $^{63}Ni$, $^{106}Ru$, $^{235}U$, $^{204}Tl$, $^{14}C$, $^{3}H$, $^{85}Kr$, $^{90}Sr$, $^{90}Y$, $^{147}Pm$, $^{109}Gd$, or a combination thereof.

13. The device of claim 1, wherein the radioactive layer comprises $^{241}Am$.

14. The device of claim 1, wherein the radioactive layer has a thickness of from 0.1 μm to 100 μm.

15. The device of claim 1, wherein the device further comprises: a scintillating material disposed within at least a portion of the plurality of coated cavities; a layer of a scintillating material disposed on the radioactive layer, such that the plurality of coated cavities are substantially coated by the layer of scintillating material; or a combination thereof.

16. The device of claim 15, wherein the scintillating material further performs as an energy degrader.

17. The device of claim 15, wherein the scintillating material comprises a ZnS-based phosphor, Tl:NaI, CsI, cerium-doped lutetium yttrium orthosilicate, bismuth germanate, plastic, $CeF_3$, $Eu:CaF_2$, $PbWO_4$, $CdWO_4$, $Ce:Cs_2LiYCl_6$, $Ce:LaCl_3$, $CeBr_3$, $Ce:LaBr_3$, $Pr:Lu_3Al_5O_{12}$, $Ce:LuAlO_3$, $Ce:Lu_3Al_5O_{12}$, $Ce:Y_2SiO_5$, cerium doped yttrium aluminum perovskite, cerium doped yttrium aluminum garnet, or a combination thereof.

18. The device of claim 1, wherein the first conducting layer, the second conducting layer, or a combination thereof comprise(s) a metal.

19. The device of claim 1, wherein the first conducting layer, the second conducting layer, or a combination thereof comprise(s) a metal selected from the group consisting of Al, Ti, Ni, Cu, Ga, Ag, Ir, Pt, Au, Cr, Mo, Pd, W, and combination thereof.

20. The device of claim 1, wherein the first conducting layer, the second conducting layer, or a combination thereof comprise(s) a radioisotope.

21. The device of claim 1, wherein the first conducting layer, the second conducting layer, or a combination thereof comprise(s) $^{63}Ni$.

22. The device of claim 1, wherein the first scintillation layer is in physical contact with the first conducting layer.

23. The device of claim 1, wherein the second scintillation layer is in physical contact with the second conducting layer.

24. The device of claim 1, wherein the first scintillation layer, the second scintillation layer, or a combination thereof comprise(s) a scintillating material selected from the group consisting of a ZnS-based phosphor, Tl:NaI, CsI, cerium-doped lutetium yttrium orthosilicate, bismuth germanate, plastic, $CeF_3$, $Eu:CaF_2$, $PbWO_4$, $CdWO_4$, $Ce:Cs_2LiYCl_6$, $Ce:LaCl_3$, $CeBr_3$, $Ce:LaBr_3$, $Pr:Lu_3Al_5O_{12}$, $Ce:LuAlO_3$, $Ce:Lu_3Al_5O_{12}$, $Ce:Y_2SiO_5$, cerium doped yttrium aluminum perovskite, cerium doped yttrium aluminum garnet, and combinations thereof.

25. The device of claim 1, wherein the device further comprises a charge storage device electrically coupled to the first conducting layer and the second conducting layer.

26. A charge generating device comprising:
   a substrate having a top surface and a bottom surface;
   a plurality of spaced-apart three-dimensional elements disposed on the top surface of the substrate;
   a plurality of cavities formed by the plurality of spaced-apart three-dimensional elements, the plurality of cavities being the area between the plurality of spaced-apart three-dimensional elements;
   a radiation material disposed within at least a portion of the plurality of cavities, thereby forming a plurality of at least partially filled cavities;
   a first conducting layer disposed above the plurality of at least partially filled cavities and the plurality of spaced-apart three-dimensional elements, wherein the first conducting layer is in electric contact with the plurality of spaced-apart three-dimensional elements;
   a second conducting layer disposed below the substrate, wherein the second conducting layer is in electric contact with the bottom surface of the substrate;
   a first scintillation layer disposed above the first conducting layer and in radiative contact with the first conducting layer; and
   a second scintillation layer disposed below the second conducting layer and in radiative contact with the second conducting layer.

27. The device of claim 26, wherein the plurality of spaced-apart three-dimensional elements are integrally formed with the substrate.

28. The device of claim 26, wherein the substrate and the plurality of spaced-apart three-dimensional elements comprise a wide band-gap semiconductor.

29. The device of claim 26, wherein the substrate and the plurality of spaced-apart three-dimensional elements comprise SiC, GaN, $Ga_2O_3$, diamond, GaAs, AlN, AlGaN, $Al_2O_3$, BN, AlAs, GaP, InP, $B_4C$, or a combination thereof.

30. The device of claim 26, wherein the substrate and the plurality of spaced-apart three-dimensional elements comprise SiC, $Ga_2O_3$, diamond, GaN, or $Al_2O_3$.

31. The device of claim 26, wherein each of the plurality of spaced-apart three-dimensional elements has an average characteristic dimension of from 0.5 μm to 500 μm.

32. The device of claim 26, wherein each of the plurality of spaced-apart three-dimensional elements has an average height of from 1 μm to 500 μm.

33. The device of claim 26, wherein the plurality of spaced-apart three-dimensional elements form an array and each of the plurality of spaced-apart three-dimensional elements is separated from its neighboring three-dimensional elements by a distance of from 1 μm to 500 μm (edge to edge).

34. The device of claim 33, wherein the plurality of spaced-apart three-dimensional elements form a rectangular array, a hexagonal array, or a linear array.

35. The device of claim 26, wherein the radioactive material emits alpha radiation, beta radiation, gamma radiation, or a combination thereof.

36. The device of claim 26, wherein the radioactive material emits alpha radiation.

37. The device of claim 26, wherein the radioactive material comprises $^{148}$Gd, $^{238}$Pu, $^{208}$Po, $^{210}$Po, $^{243}$Cm, $^{244}$Cm, $^{241}$Am, $^{63}$Ni, $^{106}$Ru, $^{235}$U, $^{204}$Tl, $^{14}$C, $^{3}$H, $^{85}$Kr, $^{90}$Sr, $^{90}$Y, $^{147}$Pm, $^{109}$Gd, or a combination thereof.

38. The device of claim 26, wherein the radioactive material comprises $^{241}$Am.

39. The device of claim 26, wherein the first conducting layer, the second conducting layer, or a combination thereof comprise(s) a metal.

40. The device of claim 26, wherein the first conducting layer, the second conducting layer, or a combination thereof comprise(s) a metal selected from the group consisting of Al, Ti, Ni, Cu, Ga, Ag, Ir, Pt, Au, Cr, Mo, Pd, W, and combination thereof.

41. The device of claim 26, wherein the first conducting layer, the second conducting layer, or a combination thereof comprise(s) a radioisotope.

42. The device of claim 26, wherein the first conducting layer, the second conducting layer, or a combination thereof comprise(s) $^{63}$Ni.

43. The device of claim 26, wherein the first scintillation layer is in physical contact with the first conducting layer.

44. The device of claim 26, wherein the second scintillation layer is in physical contact with the second conducting layer.

45. The device of claim 26, wherein the first scintillation layer, the second scintillation layer, or a combination thereof comprise(s) a scintillating material selected from the group consisting of a ZnS-based phosphor, Tl:NaI, CsI, cerium-doped lutetium yttrium orthosilicate, bismuth germanate, plastic, $CeF_3$, $Eu:CaF_2$, $PbWO_4$, $CdWO_4$, $Ce:Cs_2LiYCl_6$, $Ce:LaCl_3$, $CeBr_3$, $Ce:LaBr_3$, $Pr:Lu_3Al_5O_{12}$, $Ce:LuAlO_3$, $Ce:Lu_3Al_5O_{12}$, $Ce:Y_2SiO_5$, cerium doped yttrium aluminum perovskite, cerium doped yttrium aluminum garnet, and combinations thereof.

46. The device of claim 26, wherein the device further comprises a charge storage device electrically coupled to the first conducting layer and the second conducting layer.

47. A charge generating device comprising:
a substrate having a top surface and a bottom surface;
a plurality of spaced-apart three-dimensional elements disposed on the top surface of the substrate;
a plurality of cavities formed by the plurality of spaced-apart three-dimensional elements, the plurality of cavities being the area between the plurality of spaced-apart three-dimensional elements;
a scintillating material disposed within at least a portion of the plurality of cavities, thereby forming a plurality of at least partially filled cavities;
a first conducting layer disposed above the plurality of at least partially filled cavities and the plurality of spaced-apart three-dimensional elements, wherein the first conducting layer is in electric contact with the plurality of spaced-apart three-dimensional elements;
a second conducting layer disposed below the substrate, wherein the second conducting layer is in electric contact with the bottom surface of the substrate;
a first scintillation layer disposed above the first conducting layer and in radiative contact with the first conducting layer; and
a second scintillation layer disposed below the second conducting layer and in radiative contact with the second conducting layer.

48. The device of claim 47, wherein the plurality of spaced-apart three-dimensional elements are integrally formed with the substrate.

49. The device of claim 47, wherein the substrate and the plurality of spaced-apart three-dimensional elements comprise a wide band-gap semiconductor.

50. The device of claim 47, wherein the substrate and the plurality of spaced-apart three-dimensional elements comprise SiC, GaN, $Ga_2O_3$, diamond, GaAs, AlN, AlGaN, $Al_2O_3$, BN, AlAs, GaP, InP, $B_4C$, or a combination thereof.

51. The device of claim 47, wherein the substrate and the plurality of spaced-apart three-dimensional elements comprise SiC, $Ga_2O_3$, diamond, GaN, or $Al_2O_3$.

52. The device of claim 47, wherein each of the plurality of spaced-apart three-dimensional elements has an average characteristic dimension of from 0.5 μm to 500 μm.

53. The device of claim 47, wherein each of the plurality of spaced-apart three-dimensional elements has an average height of from 1 μm to 500 μm.

54. The device of claim 47, wherein the plurality of spaced-apart three-dimensional elements form an array and each of the plurality of spaced-apart three-dimensional elements is separated from its neighboring three-dimensional elements by a distance of from 1 μm to 500 μm (edge to edge).

55. The device of claim 54, wherein the plurality of spaced-apart three-dimensional elements form a rectangular array, a hexagonal array, or a linear array.

56. The device of claim 47, wherein the device further comprises a radioactive layer disposed on at least a portion of the plurality of spaced-apart three-dimensional elements and the top surface such that the plurality of cavities and the top surface are substantially coated by the radioactive layer, thereby forming a plurality of coated cavities such that the scintillating material is disposed within at least a portion of the plurality of coated cavities.

57. The device of claim 56, wherein the radioactive layer emits alpha radiation, beta radiation, gamma radiation, or a combination thereof.

58. The device of claim 56, wherein the radioactive layer emits alpha radiation.

59. The device of claim 56, wherein the radioactive layer comprises $^{148}$Gd, $^{238}$Pu, $^{208}$Po, $^{210}$Po, $^{243}$Cm, $^{244}$Cm, $^{241}$Am, $^{63}$Ni, $^{106}$Ru, $^{235}$U, $^{204}$Tl, $^{14}$C, $^{3}$H, $^{85}$Kr, $^{90}$Sr, $^{90}$Y, $^{147}$Pm, $^{109}$Gd, or a combination thereof.

60. The device of claim 56, wherein the radioactive layer comprises $^{241}$Am.

61. The device of claim 56, wherein the radioactive layer has a thickness of from 0.1 μm to 100 μm.

62. The device of claim 56, wherein the scintillating material is disposed as a layer on the radioactive layer, such that the plurality of coated cavities are coated by the layer of scintillating material.

63. The device of claim 47, wherein the scintillating material comprises a ZnS-based phosphor, Tl:NaI, CsI, cerium-doped lutetium yttrium orthosilicate, bismuth germanate, plastic, $CeF_3$, $Eu:CaF_2$, $PbWO_4$, $CdWO_4$, $Ce:Cs_2LiYCl_6$, $Ce:LaCl_3$, $CeBr_3$, $Ce:LaBr_3$, $Pr:Lu_3Al_5O_{12}$, $Ce:LuAlO_3$, $Ce:Lu_3Al_5O_{12}$, $Ce:Y_2SiO_5$, cerium doped yttrium aluminum perovskite, cerium doped yttrium aluminum garnet, or a combination thereof.

64. The device of claim 47, wherein the scintillating material further performs as an energy degrader.

65. The device of claim 47, wherein the first conducting layer, the second conducting layer, or a combination thereof comprise(s) a metal.

66. The device of claim 47, wherein the first conducting layer, the second conducting layer, or a combination thereof comprise(s) a metal selected from the group consisting of Al, Ti, Ni, Cu, Ga, Ag, Ir, Pt, Au, Cr, Mo, Pd, W, and combination thereof.

67. The device of claim 47, wherein the first conducting layer, the second conducting layer, or a combination thereof comprise(s) a radioisotope.

68. The device of claim 47, wherein the first conducting layer, the second conducting layer, or a combination thereof comprise(s) $^{63}$Ni.

69. The device of claim 47, wherein the first scintillation layer is in physical contact with the first conducting layer.

70. The device of claim 47, wherein the second scintillation layer is in physical contact with the second conducting layer.

71. The device of claim 47, wherein the first scintillation layer, the second scintillation layer, or a combination thereof comprise(s) a scintillating material selected from the group consisting of a ZnS-based phosphor, Tl:NaI, CsI, cerium-doped lutetium yttrium orthosilicate, bismuth germanate, plastic, $CeF_3$, $Eu:CaF_2$, $PbWO_4$, $CdWO_4$, $Ce:Cs_2LiYCl_6$, $Ce:LaCl_3$, $CeBr_3$, $Ce:LaBr_3$, $Pr:Lu_3Al_5O_{12}$, $Ce:LuAlO_3$, $Ce:Lu_3Al_5O_{12}$, $Ce:Y_2SiO_5$, cerium doped yttrium aluminum perovskite, cerium doped yttrium aluminum garnet, and combinations thereof.

72. The device of claim 47, wherein the device further comprises a charge storage device electrically coupled to the first conducting layer and the second conducting layer.

73. A method of making the device of claim 1, the method comprising:
    forming the plurality of spaced-apart three-dimensional elements on the top surface of the substrate; and
    depositing the radioactive layer on at least a portion of the plurality of spaced-apart three-dimensional elements and the top surface such that the plurality of cavities and the top surface are substantially coated by the radioactive layer, thereby forming the plurality of coated cavities.

74. The method of claim 73, wherein the device further comprises a scintillating material disposed within at least a portion of the plurality of coated cavities, the method further comprises depositing the scintillating material within at least a portion of the plurality of coated cavities.

75. A method of making the device of claim 26, the method comprising:
    forming the plurality of spaced-apart three-dimensional elements on the top surface of the substrate; and
    depositing the radioactive material within at least a portion of the plurality of cavities.

76. A method of making the device of claim 47, the method comprising:
    forming the plurality of spaced-apart three-dimensional elements on the top surface of the substrate; and
    depositing the scintillating material within at least a portion of the plurality of cavities.

* * * * *